US012772616B2

(12) United States Patent
Zollner et al.

(10) Patent No.: US 12,772,616 B2
(45) Date of Patent: Oct. 20, 2026

(54) III-NITRIDE p—n JUNCTION DEVICE USING POROUS LAYER

(71) Applicant: The Regents of the University of California, Oakland, CA (US)

(72) Inventors: Christian J. Zollner, Goleta, CA (US); Shuji Nakamura, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 562 days.

(21) Appl. No.: 17/794,182

(22) PCT Filed: Jan. 21, 2021

(86) PCT No.: PCT/US2021/014324
§ 371 (c)(1),
(2) Date: Jul. 20, 2022

(87) PCT Pub. No.: WO2021/150688
PCT Pub. Date: Jul. 29, 2021

(65) Prior Publication Data

US 2023/0051845 A1 Feb. 16, 2023

Related U.S. Application Data

(60) Provisional application No. 62/963,845, filed on Jan. 21, 2020.

(51) Int. Cl.
*H10H 20/825* (2025.01)
*H10H 20/811* (2025.01)
(Continued)

(52) U.S. Cl.
CPC ........ *H10H 20/825* (2025.01); *H10H 20/811* (2025.01); *H10H 20/813* (2025.01); *H10H 29/10* (2025.01)

(58) Field of Classification Search
CPC ..... H01L 33/32; H01L 33/0016; H01L 33/04; H01L 27/15; H10H 20/825; H10H 20/811;
(Continued)

(56) References Cited

U.S. PATENT DOCUMENTS 7,095,052 B2 8/2006 Lester
10,804,429 B2 * 10/2020 Wildeson ............... H05B 45/20
(Continued)

OTHER PUBLICATIONS

PCT International Search Report and Written Opinion dated Apr. 7, 2021 for PCT Application No. PCT/US2021/014324.
(Continued)

*Primary Examiner* — Mark W Tornow
(74) *Attorney, Agent, or Firm* — GATES & COOPER LLP

(57) ABSTRACT

A p-n junction based III-nitride device in which the p-type layers adjacent to the n-type layers are activated by thermal annealing with a porous n-type tunnel junction layer or layers. The porosity of the n-type tunnel junction layer(s) allows for gas exchange to occur, allowing efficient p-type nitride semiconductor activation. This porosification and activation step can be inserted wherever desired into an existing fabrication process for an LED, laser diode, or any other nitride semiconductor device. In one example, the device comprises multiple LED structures grown successively, separated by tunnel junctions and the buried p-type layers are activated by thermal annealing with adjacent porous n-type layers. Using this method, efficient monolithic multi-color LEDs can be formed.

22 Claims, 14 Drawing Sheets

(51) Int. Cl.
*H10H 20/813* (2025.01)
*H10H 29/10* (2025.01)

(58) Field of Classification Search
CPC .... H10H 20/813; H10H 29/10; H10H 20/817; H10H 20/01335; H10H 29/01
See application file for complete search history.

(56) References Cited

U.S. PATENT DOCUMENTS

| | | | | |
|---|---|---|---|---|
| 11,404,473 | B2 * | 8/2022 | Armitage | H10H 29/14 |
| 2010/0224860 | A1 | 9/2010 | Ibbetson et al. | |
| 2016/0197151 | A1 * | 7/2016 | Han | H10F 77/16<br>438/468 |
| 2020/0203556 | A1 * | 6/2020 | Feuillet | H10H 29/14 |
| 2023/0053213 | A1 * | 2/2023 | Ali | H01L 33/0075 |

OTHER PUBLICATIONS

Pasayat et al., "Fabrication of relaxed InGaN pseudo-substrates composed of micron-sized pattern arrays with high fill factors using porous GaN," Semicond. Sci. Technol., vol. 34, No. 115020, 2019.
Zhang et al., "A conductivity-based selective etching for next generation GaN devices," Phys. Status Solidi Basic Res., vol. 247, No. 7, pp. 1713-1716, 2010.

* cited by examiner

III-NITRIDE p—n JUNCTION DEVICE USING POROUS LAYER

CROSS REFERENCE TO RELATED APPLICATIONS

This application claims the benefit under 35 U.S.C. Section 119(e) of commonly-assigned U.S. Provisional Patent Application No. 62/963,845, filed Jan. 21, 2020, by Christian J. Zollner and Shuji Nakamura, entitled "III-NITRIDE P-N JUNCTION DEVICE USING POROUS LAYER,"; which application is incorporated by reference herein.

BACKGROUND OF THE INVENTION

1. Field of the Invention

This invention relates to a method of fabricating high efficiency nitride light emitting diodes (LEDs), laser diodes (LDs), electronic devices, or any other semiconductor devices making use of a tunnel junction or p-n junction, as well as the device produced thereby.

2. Description of the Related Art (Note: This application references a number of different publications as indicated throughout the specification. A list of these different publications ordered according to these reference numbers can be found below in the section entitled "References." Each of these publications is incorporated by reference herein.)

The usefulness of III-nitride layers, such as gallium nitride (GaN), and its ternary and quaternary compounds incorporating aluminum and indium (AlGaN, InGaN, AlInGaN), has been well established for the fabrication of optoelectronic devices and high-power electronic devices. Additionally, the development of tunnel junction (TJ) device structures has shown great promise for high efficiency light emitting diodes (LEDs) and laser diodes (LDs), and may also be promising for other types of semiconductor devices. A tunnel junction is a junction between two heavily doped semiconductor layers, such as a p-GaN/n-GaN interface. This junction is typically operated in reverse-bias conditions, whereby the high doping level allows electrons to tunnel from the conduction band of the n-type layer into the valence band of the p-type layer, forming a highly conductive interface with limited voltage penalty. Tunnel junctions have been demonstrated to work very well as p-side current injection layers in nitride LEDs and LDs, however device growth and processing must be designed in such a way as to allow activation of the p-GaN layer, which would be impossible in a p-GaN/n-GaN stack grown by conventional metal organic chemical vapor deposition (MOCVD) techniques.

In addition to the example of a tunnel junction, there are also numerous other applications in which a buried p-n junction is desirable. This junction comprises a multilayer with doped nitride layers such as a p-GaN layer capped by an n-GaN layer. Similarly to the case of the tunnel junction, the as-grown p-GaN is highly resistive and must be "activated" via thermal annealing, to allow hydrogen atoms in the layer to diffuse to the surface. Therefore, a buried p-GaN layer capped with n-GaN or various other layers is difficult to achieve, because the top layers prevent gas exchange and the p-GaN cannot be activated.

Current technologies for activating p-GaN in a buried p-n junction or tunnel junction structure rely on, for instance: 1) regrowing the burying layers by Molecular Beam Epitaxy (MBE), so that the p-GaN does not become passivated, 2) regrowing using selective area epitaxy, so that windows remain in the topmost layers to allow for gas exchange, or 3) etching holes down to the p-GaN layer to allow for gas exchange. All of these methods add time and cost to the LED, LD, other device fabrication processes, are of very limited efficacy for p-type GaN activation, and impose constraints on the device design space. What is needed is a method for device growth and processing with a reduced number of processing steps, eliminating these cumbersome methods. The present invention satisfies this need.

SUMMARY OF THE INVENTION

The present invention discloses a method for producing a nitride semiconductor device such as an LED or LD or any other nitride device which makes use of a buried p-n junction or tunnel junction structure, as well as the device produced thereby. In order to allow for p-GaN activation, the n-GaN layer adjacent to the p-GaN layer can be electrochemically etched (see Ref. [1]) into a porous morphology, providing efficient gas exchange. The electrochemical etch makes use of an electrolyte such as Oxalic acid to selectively etch and porosify only the most heavily n-type doped layer (i.e. the tunnel junction layer, or the highly doped layer adjacent to the buried p-type layer), while not etching the more moderately doped n-type layers throughout the structure. The details of this embodiment refer to GaN layers for simplicity, and because GaN is the most well studied of the nitride alloy materials system, but can be readily applied to any alloy in the (Ga,Al,In,B)N semiconductor materials system.

The present invention further discloses a method for producing a monolithic multi-LED stacked-diode structure capable of controllably mixing the constituent colors emitted by the diodes in the stack. In order to effectively inject current into all LED active region layers, the devices are separated by porous GaN tunnel junctions. The porous GaN tunnel junction layers allow all p-type layers within the multi-LED stack to be activated by thermal annealing. Simultaneously, the porous n-GaN layers in the stack may also serve as stress- or strain-relaxation layers, which enhance long-wavelength visible nitride LED efficiency shown in Ref. [2]. This relaxation layer also minimizes the stress caused by hetero-epitaxial growth on a foreign substrate. If this growth stress is too large, substrate bowing, cracking, or delamination can occur. Using standard semiconductor processing techniques, the stacked diode structure can be patterned into a device with individually controllable power output for each of the diodes in the stack, allowing for color mixing between the various emission wavelengths, in the preferred embodiment. Other possible embodiments could comprise any number of stacked diodes, individually controllable or collectively powered in series, of any desired wavelength, or all of the same wavelength. If grown on an absorbing substrate such as silicon, a mirror such as a distributed Bragg reflector (DBR) may be implemented, either by depositing the DBR epitaxially on the growth substrate before LED growth, or by depositing it on a separate substrate which may then be bonded to the LED for a flip-chip structure with substrate removal. This DBR may comprise an alternating stack of bulk- and porous-GaN.

Example devices and methods described herein include, but are not limited to, the following.

1. A III-nitride based device, comprising:

one or more tunnel junctions each formed by an n-type layer deposited atop a p-type layer, wherein the n-type layer is a porous layer.

2. A III-nitride based device, comprising:

one or more structures each including a p-type layer adjacent to an n-type layer, wherein the n-type layer is a porous layer.

3. A device, comprising:

III-nitride layers including:

an active region between an n-type layer and a p-type layer; and a porous n-type layer on or above the p-type layer, wherein the porous n-type layer forms a tunnel junction with the p-type layer.

4. The III-nitride based device of any of the examples 1-3, wherein the porous n-type layer is made into the porous layer by electrochemical etching so as to form an electrochemically etched porous n-type layer.

5. The III-nitride based device of any of the examples 1-4, wherein the p-type layer comprises an as-grown acceptor doped layer further processed by removing hydrogen from inside the p-type layer and at least partially through the porous layer.

6. The III-nitride based device of example 5, wherein the as-grown acceptor doped layer is doped with an acceptor and the acceptor is magnesium.

7. The device of examples 5 or 6, wherein the hydrogen is removed using thermal annealing of the device, with an ambient gas comprising at least some air, oxygen, water, or mixed gases.

8. The device of example 7, wherein the thermal annealing is at a temperature higher than 300° C.

9. The III-nitride based device of any of the examples 1-8, wherein the porous n-type layer and the p-type layer comprise GaN, AlGaN, InGaN, or any other nitride alloy (Al, Ga,In,B)N.

10. The III-nitride based device of any of the examples 1-9, wherein:

a concentration of donors in the porous n-type layer is greater than $10^{17}$ $cm^{-3}$, and the donors comprise Si, Ge, or other impurities.

11. The III-nitride based device of example 10, wherein the concentration of donors in the porous n-type layer is greater than $10^{18}$ $cm^{-3}$ (e.g., $1\times10^{18}$ $cm^{-3}\leq$donor density $D\leq5\times10^{20}$ $cm^{-3}$).

12. The III-nitride based device of the example 11, wherein the concentration of donors in the porous n-type layer is greater than $10^{19}$ $cm^{-3}$.

13. The III-nitride based device of any of the examples 10-12, further comprising one or more n-type tunnel junction layers including the porous n-type layer, wherein a concentration of Ge in the one or more n-type tunnel junction layers is greater than $10^{17}$ $cm^{-3}$.

14. The III-nitride based device of any of the examples 1-13, wherein the device is grown on a c-plane oriented substrate.

15. The III-nitride based device of any of the examples 1-13, wherein the device is grown on an m-plane or other nonpolar oriented substrate.

16. The III-nitride based device of any of the examples 1-13, wherein the device is grown on a semipolar oriented substrate.

17. The III-nitride based device of any of the examples 1-13, wherein the device is grown on a sapphire substrate.

18. The III-nitride based device of any of the examples 1-13, wherein the device is grown on a silicon substrate.

19. The III-nitride based device of any of the examples 1-13, wherein the device is grown on a silicon carbide substrate.

20. The III-nitride based device of any of the examples 1-13, wherein the device is grown on a free-standing GaN substrate.

21. The III-nitride based device of any of the examples 1-13, wherein the device is grown on a free-standing AlN substrate.

22. The III-nitride based device of any of the examples 1-21, wherein the device is grown on a relaxed alloy substrate comprising a relaxed alloy on a foreign substrate, wherein the relaxed alloy comprises InGaN or other III-Nitride and the foreign substrate comprises sapphire or another material different from III-Nitride.

23. The III-nitride based device of any of the examples 1-22, wherein the p-type layer is buried by or under the porous n-type layer (e.g. so that removal of hydrogen from the p-type layer is predominantly through the porous layer).

24. The III-nitride device of any of the examples 1-23, further comprising:

a substrate;

the porous layer on or above the substrate;

the p-type layer on the porous layer, wherein the porous layer is between the substrate and the p-type layer;

an active region on the p-type layer, wherein the p-type layer is between the active region and the substrate;

an n-type layer on the active region, the active region emitting electromagnetic radiation in response to an electric field applied between the n-type layer and the porous layer.

25. The III-nitride based device of any of the examples 1-25, comprising a plurality of the tunnel junction structures.

26. The III-nitride based device of any of the examples 1-25 comprising one or more light emitting diodes (LEDs).

27. The III-nitride device of example 26, comprising a plurality of LED structures grown in the same vertical layer stack, wherein one of the tunnel junctions separates each of the LED structures.

28. The III-nitride device of examples 27, comprising at least three of the LED structures, each of the three LED structures emitting at a different wavelength.

29. The III-nitride device of example 28, wherein:

the at least three LED structures LEDA, LEDB, and LEDC emit wavelengths corresponding to blue, green, and red light, respectively and one of the tunnel junctions is between LED A and LED B, one of the tunnel junctions is between LED B and LED C, one of the tunnel junctions is on LED C.

30. The III-nitride device of any of the examples 27-29, wherein each of the LEDs can be individually electrically driven, so as to produce a mixture of various wavelengths of light with controllable brightness.

31. The III-nitride device of any of the examples 1-30, wherein the porous n-type layer is a stress reduction layer.

32. A monolithically integrated display comprising the light emitting diodes of any of the examples 25-31.

33. A display comprising the light emitting diodes of any of the examples 25-32, wherein the display is formed or grown on a transparent sapphire substrate or other transparent substrate, such that the preferred light emission direction from the LEDs is downward through the transparent substrate.

34. A display comprising the light emitting diodes of any of the examples 25-33, wherein the light emitting diodes are fabricated as top emitting devices emitting light through a top surface of the LEDs.

35. The III-nitride device of any of the examples 25-34, wherein the light emitting diodes comprise stacked diode devices that are mass-transferred onto a new substrate selected from a silicon, sapphire, glass substrate, other transparent substrate, or other non-transparent substrate.

36. The III-nitride device of any of the examples 25-35, further comprising ohmic contacts to the LED structures that also form metal bonding pads for wafer bonding, wherein the ohmic contacts comprise Au, In/Au, or any other bonding metal.

37. The III-nitride device of examples 25-36, further comprising a reflective mirror structure connected to the LED structures.

38. The III-nitride device of example 37, wherein the reflective mirror structure is a Distributed Bragg Reflector (DBR).

39. The III-nitride device of example 38, wherein the DBR comprises alternating layers of porous- and nonporous III-nitride.

40. The III-nitride device of example 39, wherein the DBR comprises alternating layers of porous and non-porous gallium nitride.

41. A method of making a III-nitride based device, comprising:
- depositing an n-type layer atop a p-type layer so as to form a tunnel junction between the n-type layer and the p-type layer, wherein the n-type layer is a porous layer.

42. A method of making a III-nitride based device, comprising:
- forming one or more structures each including a p-type layer adjacent to an n-type layer, wherein the n-type layer is a porous layer.

43. The method of examples 41 or 42, further comprising electrochemical etching pores or voids in the n-type layer so as to form the porous layer after formation of the structure or deposition of the n-type layer.

44. The method of any of the examples 41-43, comprising:
- forming the n-type layer on the p-type layer comprising an as-grown acceptor doped layer; and
- removing hydrogen from inside the p-type layer and at least partially through the porous layer.

45. The method of example 44, wherein the removing comprises thermally annealing the device with an ambient gas comprising at least some air, oxygen, water, or mixed gases.

46. The method of example 45, wherein thermal annealing is at a temperature higher than 300° C.

47. The device of examples 1-3 and 9-40 fabricated using the method of any of the examples 40-45.

48. The device or method of any of the examples 1-47, wherein the porous layer comprises pores or voids having a diameter in a range of 0.1-1000 micrometers.

49. The device or method of any of the examples 1-48, wherein the porous layer comprises a density of pores or voids sufficient to allow hydrogen to escape from the p-type layer and activate the p-type layer.

BRIEF DESCRIPTION OF THE DRAWINGS

Referring now to the drawings in which like reference numbers represent corresponding parts throughout:

FIG. 6A shows buried tunnel junctions are used to connect multiple stacked diodes, enabling, for instance, multicolor emission. See, e.g. U.S. Pat. No. 7,095,052 B2. In the present invention (shown in FIG. 6C, and FIG. 6D), this stacked diode structure is made possible because porous GaN layers adjacent to buried p-GaN layers enable activation of Mg doped layers. Additionally, porous GaN layers can be inserted into the buffer layer area of the epitaxial stack, to be used as stress or strain relaxation layers. In a preferred embodiment, the LED layers to be grown have blue, then green, then red emitting active regions.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.

Technical Description

Overview

The growth and processing of nitride TJs and p-n junctions with buried p-type layers is more challenging than in the conventional III-V materials, because Mg-doped GaN is not p-type as grown, and must be activated by thermal annealing. This activation process cannot occur if the p-GaN is buried within a multilayer stack, and therefore the p-GaN must be the topmost layer in conventional nitride LED structures. If a buried tunnel junction or buried p-n junction is to be successfully implemented, there must be a way to activate the p-GaN. Buried p-GaN activation can be achieved using small mesa structures (micro-LEDs), or with lithographically defined regrowth patterns, or with lithographically patterned etch structures, but all of these methods of removing the hydrogen from the sidewalls are not enough to get a good p-type layer.

Figure 2:
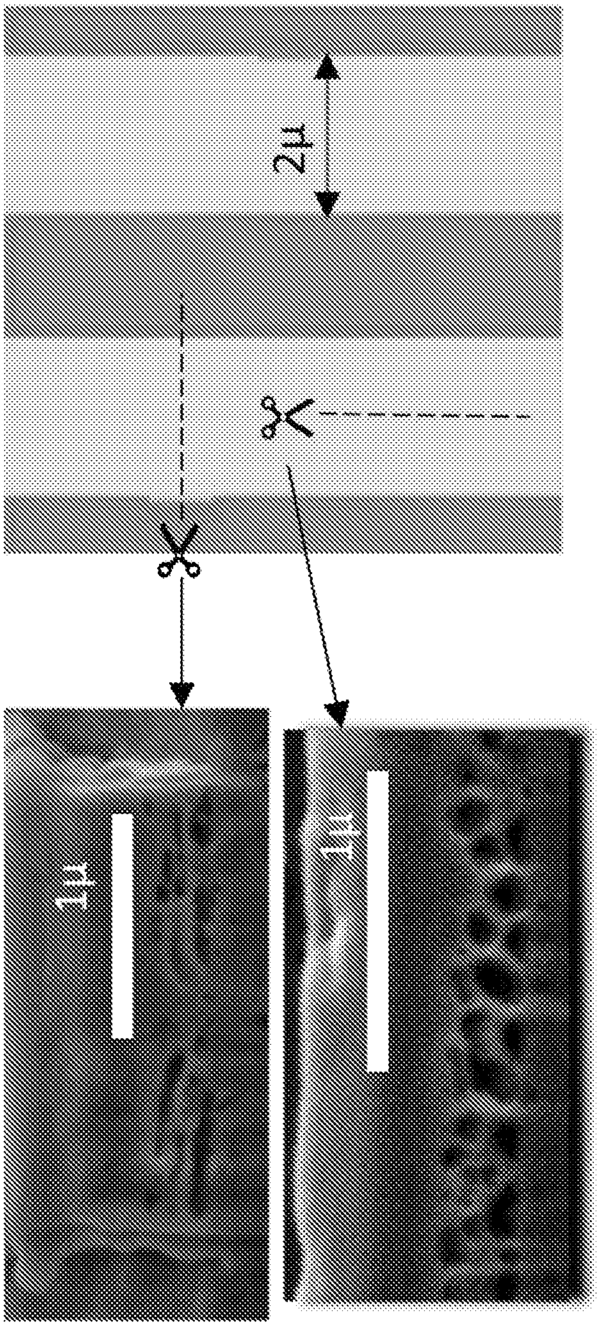
FIG. 2 is a scanning electron microscope image of a cross-sectioned nitride layer which has been porosified (rendered porous) using the oxalic acid electrochemical etching method described herein. Source: S S Pasayat et al., Semicond. Sci. Technol. 34 (2019) 115020. The image shows the voids which have been produced, which allow for gas exchange and p-GaN activation.

Zhang et al. have shown (Ref. [1]) that highly n-doped GaN can be electrochemically etched in such a way as to produce so-called nanoporous GaN (see FIG. 2). The pores produced by this method can be used as gas exchange channels, allowing the underlying or adjacent p-GaN to be activated by thermal annealing in the conventional way.

In the present invention, we disclose a device structure in which the n-GaN adjacent to the p-GaN within a p-n junction is made porous using electrochemical etching, allowing an efficient gas exchange pathway for effective p-GaN activation. Such a method which allows gas exchange to occur through a porous top n-GaN or adjacent n-GaN porous layer is highly desirable.

This method can also be applied to AlGaN, InGaN or any alloy within the (Ga,Al,In,B)N semiconductor material system. The present invention further describes a nitride semiconductor device (such as a light emitting diode, laser diode, or any other electronic device) that includes a buried p-n junction, such as, in one possible embodiment, a tunnel junction.

1. First Example: General Tunnel Junction Device Fabrication a. Overview

In general, a method for producing the porous nitride tunnel junction device comprises the following steps:

(1) Growth of a device including, but not limited to, a LED. Growth may occur by MOCVD, MBE, or any other growth method, however MOCVD is the most common method used in the electronic or optoelectronic device (e.g., LED) industry. The device may comprise a buffer layer grown on a sapphire or silicon or silicon carbide substrate, or any other foreign substrate. It may otherwise comprise bulk or “free standing” GaN (or AlN) substrate. The layers deposited on or above the substrate may comprise alloys other than GaN, such as AlInN, AlGaN, AlInGaN, InGaN, etc. The layer deposited on or above the substrate may also have a varying or graded composition. In addition, the layer deposited on or above the substrate may comprise various thicknesses. Moreover, multiple such layers may be deposited on or above the substrate, wherein these multiple layers may comprise a heterostructure containing layers of dissimilar (Al,Ga,In,B)N composition. Device growth may proceed with growth of an n-type layer or layers, an active region including light-emitting layers or other active layers, and a p-type region. In the case of a laser diode, other layers may be included such as cladding or Distributed Bragg Reflector (DBR) layers or any other layer needed for laser operation, but it is to be understood that the present embodiment applies to all such structures. If desired, a porous n-GaN buffer layer may be grown, to serve as a stress-relaxation layer.

(2) Once the LED or other device structure has been grown, ending with a p-GaN contact layer, an n-type doped tunnel junction layer may be grown immediately. Alternatively, the sample could be removed from the reactor for p-GaN activation or other processing steps, and then loaded into the reactor again for a regrowth of the tunnel junction layers.

(3) Next, LED or other device processing and fabrication steps may be completed, including etching, metal deposition and patterning, dielectric deposition and patterning, mirror deposition, ion implantation, or any other relevant semiconductor processing step needed to fabricate the desired device.

(4) At some point during the standard LED processing discussed in step (3), the Oxalic acid based electrochemical etching porosification procedure may be used. The details of the Oxalic acid etching procedure may vary significantly while remaining within the scope of this embodiment. For instance, an acid concentration of 0.3M, and an acid temperature of 25° C., and an applied voltage between 10V and 20V may be used (as described in [1]); these conditions may be varied in order to optimized the desired etch rates and porous morphology for p-GaN activation or other desired properties.

(5) If needed, additional LED or other device processing steps may be undertaken after porosification, as described in step (3).

b. Example Process Steps

Figure 1:
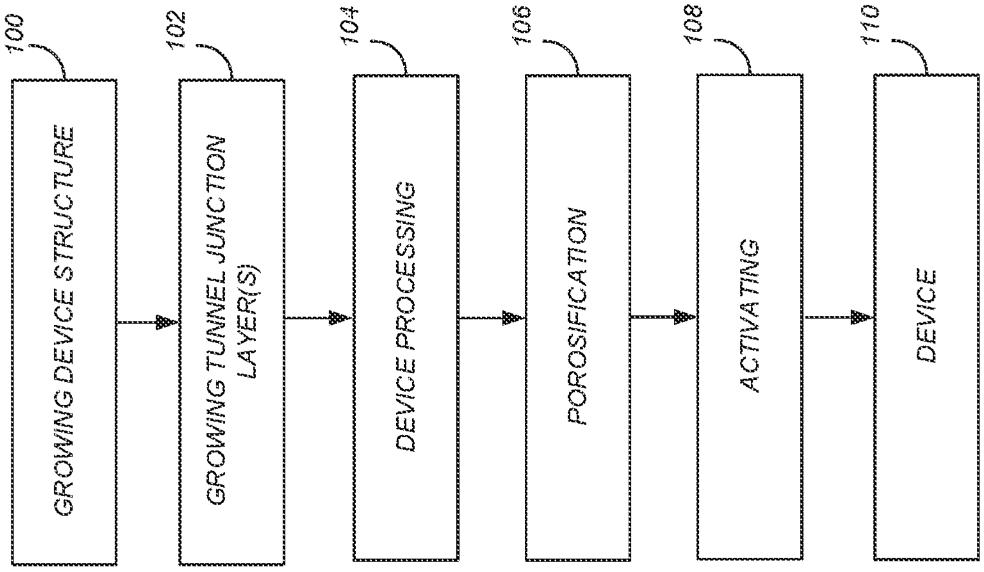
FIG. 1 is a flowchart that illustrates the steps for the fabrication of a porous tunnel junction or buried p-n junction device, according to one embodiment of the present invention. This process could be modified to produce any other type of buried p-n junction device; the preferred embodiment of the porous GaN tunnel junction is given here simply as an example.

FIG. 1 is a flowchart that illustrates the steps for the treatment of a semiconductor substrate, according to one embodiment of the present invention.

Block 100 represents the step of growing the desired semiconductor device structure such as an LED, LD, or any other device in which a tunnel junction is desired. After growth, the sample may be removed from the reactor to thermally active the p-GaN, or thermally activated in-situ within the reactor, or simply left inside the reactor for the succeeding growth of the TJ layers, described in Block 102.

Block 102 represents the subsequent growth or regrowth of the tunnel junction layers; in the case of an LED, the tunnel junction layers comprised a heavily p-type doped GaN layer, followed by a heavily doped n-type layer, for instance. Other layers such as an InGaN tunneling layer, or other layers with various doping and alloy compositions may be used as well. It is to be understood that, while the example of a tunnel junction is given here, this process could be modified as needed to produce any buried p-n junction device. The only requirement is that each buried p-type layer be adjacent on at least one side to an n-type GaN layer which will be made porous.

Block 104 represents the LED, LD or other device fabrication using standard semiconductor processing techniques, such as etching, metal deposition, dielectric deposition, mirror fabrication, ion implantation, or any other desired fabrication steps.

Figure 3:
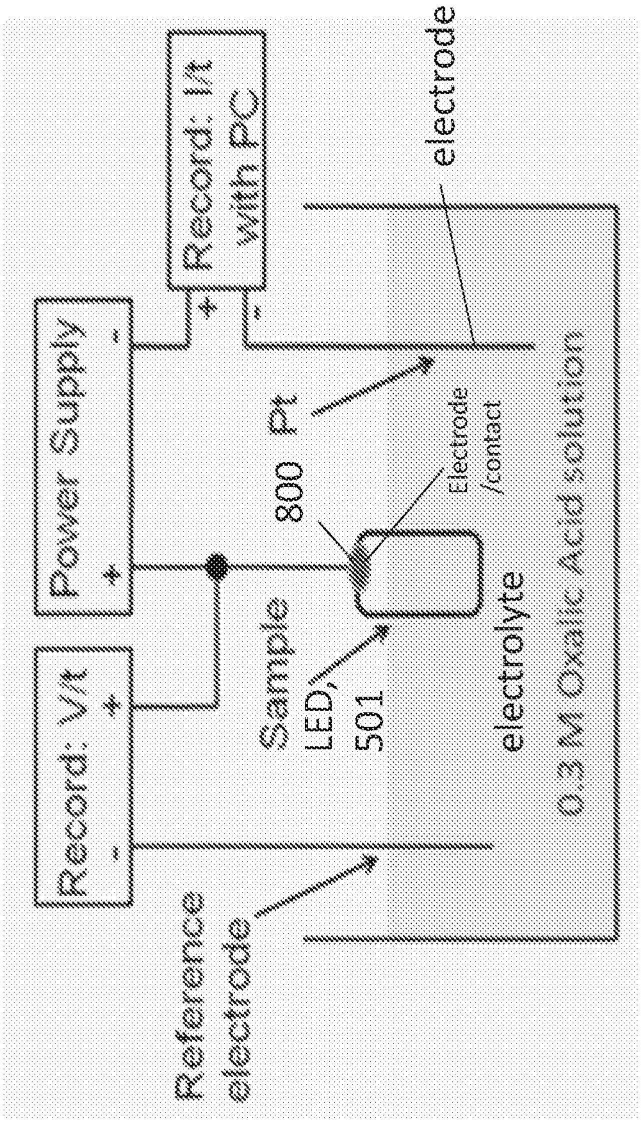
FIG. 3 is a schematic of an experimental setup by which a porous n-GaN layer may be produced. In the III-nitride porosification process, the sample is held at a constant voltage, in this embodiment, with respect to the liquid electrolyte, via the power supply. Simultaneously, current versus time (I/t) and voltage versus time (V/t) are measured as shown. A Pt electrode is used to make contact with the electrolyte. Taken from Zhang Y, Ryu S W, Yerino C, Leung B, Sun Q, Song Q, Cao H and Han J 2010 Phys. Status Solidi B 247 1713-6.

Block 106 represents the GaN porosification step, which may be inserted wherever desired into the LED or other device fabrication process. A bath of 0.3M oxalic acid is prepared, and the sample is electrically contacted using indium contacts, or lithographically patterned metal contacts, or any other desired method for making electrical connection to the GaN layer which is to be porosified. A Pt or other metal electrode may be used to make electrical contact with the electrolyte. The electrolyte may be stirred using a magnetic stirring rod. A schematic of one possible embodiment of this step is shown in FIG. 3, reproduced from the publication of Zhang et al. [1].

Block 108 represents the activation of the p-GaN by thermal annealing. The porosity of the n-type GaN tunnel junction layer allows for efficient gas exchange at the tunnel junction interface, and the p-GaN becomes activated.

Blocks 104, 106, and 108 may be completed in any desired order, and repeated as needed, until the desired LED, laser, or other device is complete.

Block 110 represents the completed III-nitride semiconductor device that includes a porous GaN tunnel junction (or other porous nitride layer buried p-n junction).

Note that this embodiment allows for steps to be omitted, repeated, added or taken in any desired order.

c. Experimental Data

FIG. 2 shows a scanning electron microscope of a porous GaN layer, reproduced from Ref. [2]. The right side of the figure is a schematic, showing one possible embodiment of this invention: the patterning of GaN stripes such as those which might be used for an edge-emitting laser diode. The top left and bottom left images show longitudinal and lateral cross sections of the GaN bar, respectively. As can be observed, the large voids produced in the GaN material provide a gas exchange pathway which could be used to thermally activate an underlying p-GaN layer in a tunnel junction geometry.

FIG. 3 shows a schematic of the type of porosification setup which could be used, reproduced from Ref [1]. The sample is held at a constant voltage, in this embodiment, with respect to the liquid electrolyte, via the power supply. Simultaneously, current versus time (I/t) and voltage versus time (V/t) are measured as shown. A Pt electrode is used to make contact with the electrolyte.

d. Advantages and Improvements

Previous methods for producing tunnel junctions in particular, and buried p-n junctions in general, are complicated by the difficulty of activating p-GaN, which is performed using a thermal anneal. For this step to be successful, the p-GaN must typically lie at the sample surface, to allow gas exchange of hydrogen atoms from inside the p-GaN layer to escape into the atmosphere. For this reason, conventional nitride LEDs, lasers, and other devices are grown with the p-GaN layer(s) grown last, so that it lies at the top of the layer stack and can be thermally activated. It is desirable to deposit a heavily n-type doped tunnel junction layer on top of the p-GaN layer for various reasons, including improving device efficiency by enhancing current spreading, reducing voltage, and increasing light extraction efficiency, as well as opening up the device design space to accommodate novel designs such as stacks of multiple p-n junction diodes atop one another, connected by tunnel junctions. It may also be desirable to produce buried p-n junctions for other reasons, such as to produce a p-down LED structure, or any other type of semiconductor device in which a buried p-type layer is desired.

Because MOCVD growth causes passivation of p-GaN, a method for activation of a buried p-GaN is desirable. This can be achieved by, for instance, etching holes through the n-GaN to partially expose the p-GaN surface. It can also be achieved by patterning the device before burying layer regrowth, so that the burying layers do not cover the entire surface, and the p-GaN can be activated after regrowth. Both of these methods add complication, time, and cost to the LED or other device fabrication process, and restrict the device design space.

The present disclosure describes a method of producing an LED, LD, or other semiconductor device with a porous-GaN enabled buried p-n junction, such as a tunnel junction, as well as a device produced thereby. The use of a porous GaN buried junction structure solves the above identified problems (increased time, cost and restricted device design space) by allowing gas exchange to occur through a porous top n-GaN or adjacent n-GaN porous layer so as to conveniently and efficiently activate the buried p-type layers. These methods may be implemented into existing LED or other device growth and fabrication methods as needed to produce a buried p-n junction device. Thus, the porous n-GaN layer adjacent to each buried p-GaN layer allows a relatively simple and low-cost p-GaN activation process, allowing for highly efficient devices and novel device designs not previously achievable. In one or more examples, devices can be fabricated without the need for MBE growth, or without lithographic patterning of small mesas or holes.

2. Second Example: Monolithic Multicolor III-Nitride LED or Micro LED Display Making Use of a Porous Tunnel Junction a. Overview

One of the most promising device designs made possible by an efficient buried p-n junction, such as the porous GaN tunnel junction, is the stacked-diode device structure. In such a structure, multiple LED layer stacks can be grown in series, separated by tunnel junctions. When the LED stack is operated in forward bias, the reverse-biased tunnel junctions provide a low-voltage-penalty means for injecting carriers into all LED active regions. Beginning with a stacked diode structure wherein each LED operates at a different wavelength, a multi-wavelength emitting device can be produced. If this device structure is fabricated into a device with individually controllable LED layers, it can be operated as a "pixel" in which the constituent colors are mixed to produce any desired color according to the standard RGB color mixing model.

In order to produce a stacked diode structure, buried p-n junctions including tunnel junctions are needed. A tunnel junction comprises a heavily doped p-n diode structure, in which the high doping levels allow efficient interband tunneling to occur at relatively low reverse bias voltages. Thus, a reverse-biased tunnel junction may be used to separate the p- and n-type regions of adjacent diodes in a stacked structure.

The present invention describes a nitride semiconductor device comprising a stacked-diode multi-LED structure, wherein porous-GaN tunnel junctions separate the LED layers. In the preferred embodiment, this stacked diode device is used to form a color-controllable pixel with red, green, and blue active regions individually controllable by lithographically patterned metal contacts. The crucial technology enabling this invention is the porous GaN tunnel junction described in the first example. The oxalic acid electrochemical porosification method can be used to selectively porosify highly doped n-GaN, found only in the tunnel junction layer, without affecting the moderately doped n-GaN found in the LED layers. A stacked diode structure is nearly impossible to achieve using conventional MOCVD grown material, as there is no way to activate buried p-GaN layers. For this reason, activation via gas-exchange channels etched into a porous n-GaN layer which is adjacent to the p-GaN, is the crucial technology to enable this device.

In this embodiment, the example of a nitride red, green, blue LED stack is described. However, it is to be understood that similar methods can be applied to any nitride device utilizing porous GaN tunnel junctions for stacked-diode structures or III-nitride LED devices comprising a stack of diodes emitting at various wavelengths.

In general, the method for producing the porous nitride tunnel junction multi-LED stacked-diode structure comprises the following steps:

(1) In a first step, any various types of layers suitable for fabrication of the first LED may be deposited. In the preferred embodiment, the first LED stack to be grown is that of the blue-emitting layer. This layer is likely to be grown at the highest temperature, making it most convenient to grow it first. Additionally, in a downward emitting device, this will allow much of the blue light to be emitted through the bottom of the epi stack without interacting with the absorbing green and red quantum well layers. In a top-emitting structure, this step may include the growth of a DBR layer stack. If a porous-GaN DBR layer is desired, this growth step would comprise alternating growth of heavily doped and undoped (or lightly doped) GaN layers, such that the highly doped layers can later be porosified. This LED section's growth may proceed with growth of an n-type layer or layers, an active region including light-emitting layers or other active layers possibly including an electron blocking layer, and a p-type region. At this point in the method described here, the epitaxial stack may resemble a typical blue LED structure.

(2) Following the first (in the preferred embodiment, blue) LED multilayer structure, the first tunnel junction layer is grown, comprising highly doped p-GaN and n-GaN layers. If desired, more complicated multilayers including InGaN or AlGaN interlayers, or any other type of interlayer, or layers with various doping concentrations or alloy compositions may be grown as well. The n-GaN layer serves both as a tunnel junction layer, as well as the porous GaN layer enabling gas exchange.

(3) Next, the second (e.g. green) LED multilayer can be grown, following similar procedures as outlined in step 1.

(4) Following the second LED structure, the second tunnel junction structure can be grown, following similar procedures as in step 2.

(5) Finally, the third (e.g. red) LED multilayer can be grown, following similar procedures to step 1.

(6) If desired, a final tunnel junction layer may be deposited on top of the final LED stack, as in step 2.

(7) Using conventional nitride LED processing methods, the multi-LED structure may be fabricated into a device such as a stacked pixel design, or into spatially separated pixels. Processing steps may include etching, metal deposition and patterning, as well as the deposition and patterning of dielectric and mirror layers. This fabrication process will include the electrochemical etching step needed to produce the porous GaN layers.

(8) In one possible embodiment, if the layers have been deposited on a sapphire substrate and a downward emission architecture is desired, a fully monolithic red, green, and blue "display" has been produced. In a downward emitting structure, a DBR may be grown on top of the LED stack, as detailed in step (2). Alternatively, if some other substrate type is used, or if mass transfer of pixels to another substrate is desired, this can be done with flip-chip, stamping, pick and place, printing, or any other desired mass transfer technique. This other substrate may be prepared with a mirror such as DBR including a porous-GaN DBR or any other reflective structure.

These steps refer to the preferred embodiment in which a conventional n-down LED structure is used. It can be modified in a straightforward way if a novel p-down structure is preferred, as detailed in the following section. Steps may be added, omitted, or taken in any order as desired without deviating from the scope of this disclosure.

b. Example Process Steps

Figure 4:
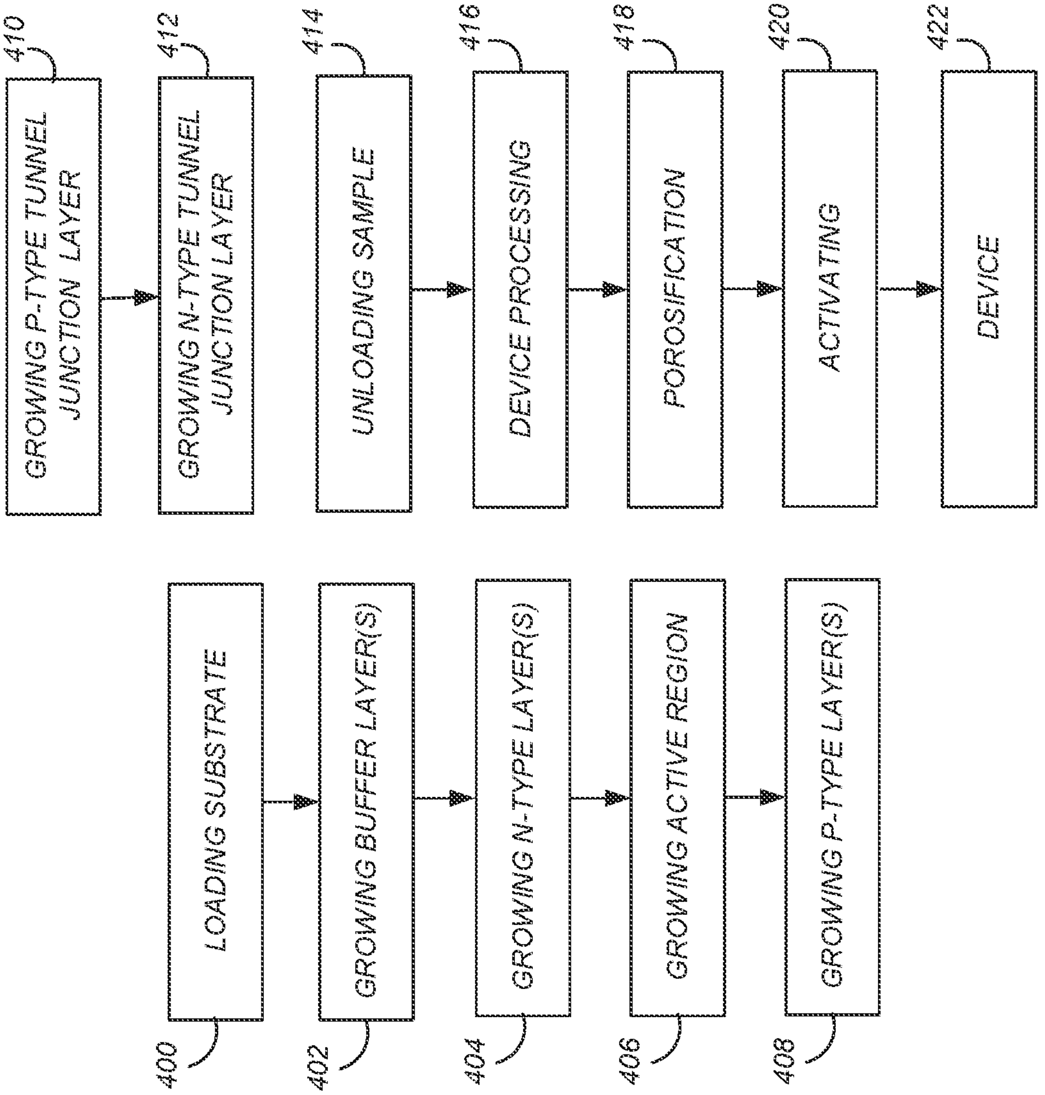
FIG. 4 is a flowchart that illustrates the steps for the fabrication of monolithic multicolor LED device, according to one embodiment of the present invention.
Figure 5B:
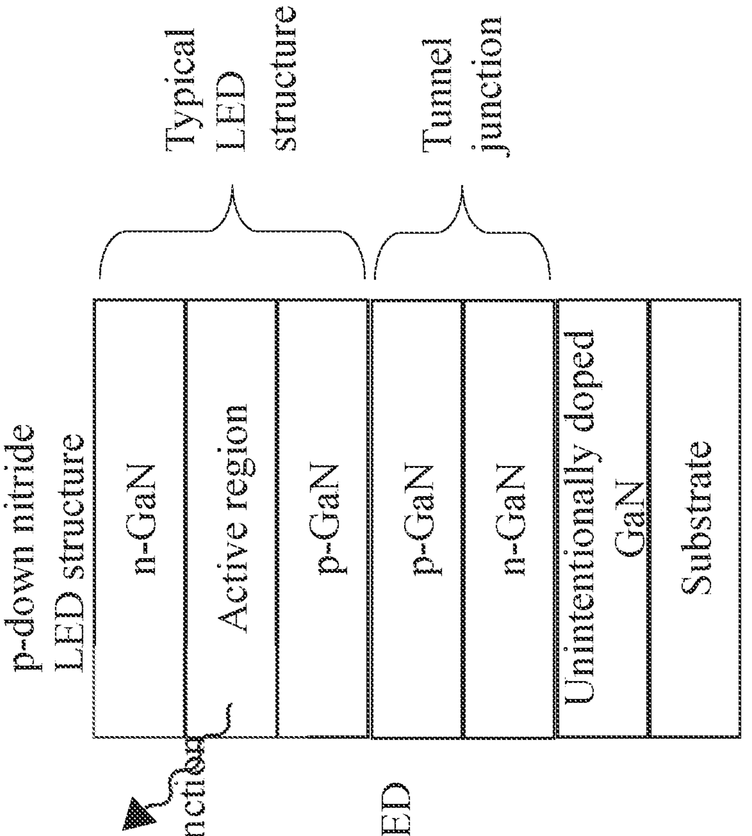
FIG. 5A-5D illustrate a schematic representation of an LED epitaxial stack making use of a tunnel junction with buried p-GaN. The device in either a conventional n-down (FIG. 5A, prior art) or novel p-down (FIG. 5B) structure contains conventional tunnel junctions and buried p-type layers, which are made active using some means other than porous n-GaN. In the present embodiment of this invention, both n-down (FIG. 5B, 5C) and p-down (FIG. 5D) structures can be produced. In both cases, buried p-type layers can be activated by thermal annealing, because the adjacent n-GaN layers are first made porous by electrochemical etching.
Figure 5A:
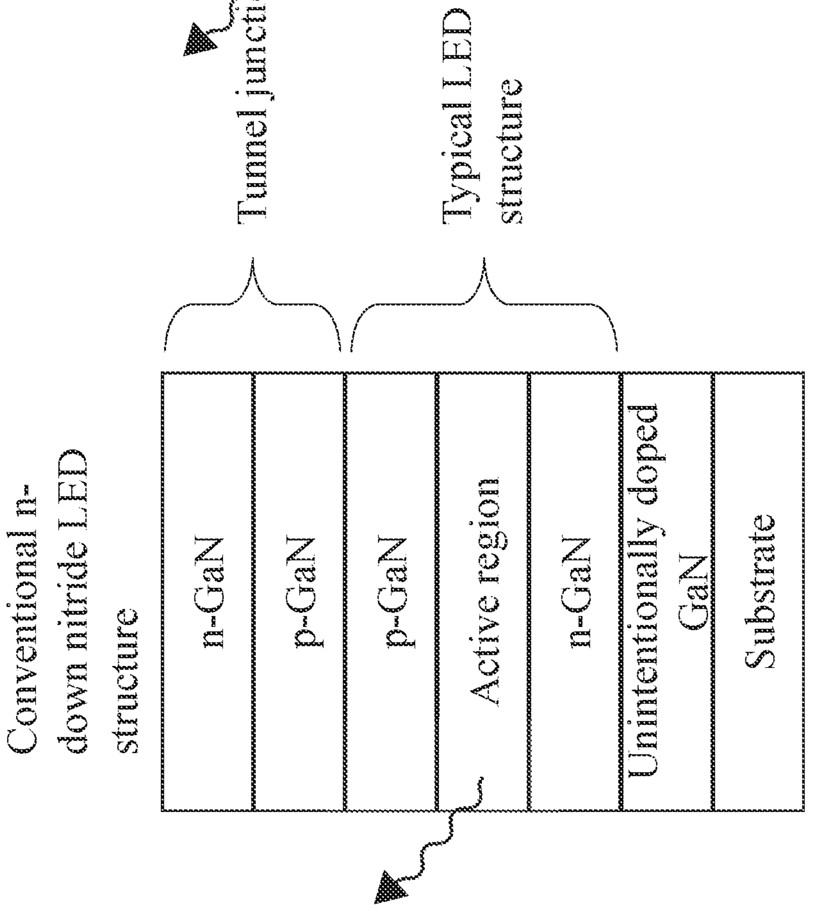
Fig. 5A Prior Art
Figure 5D:
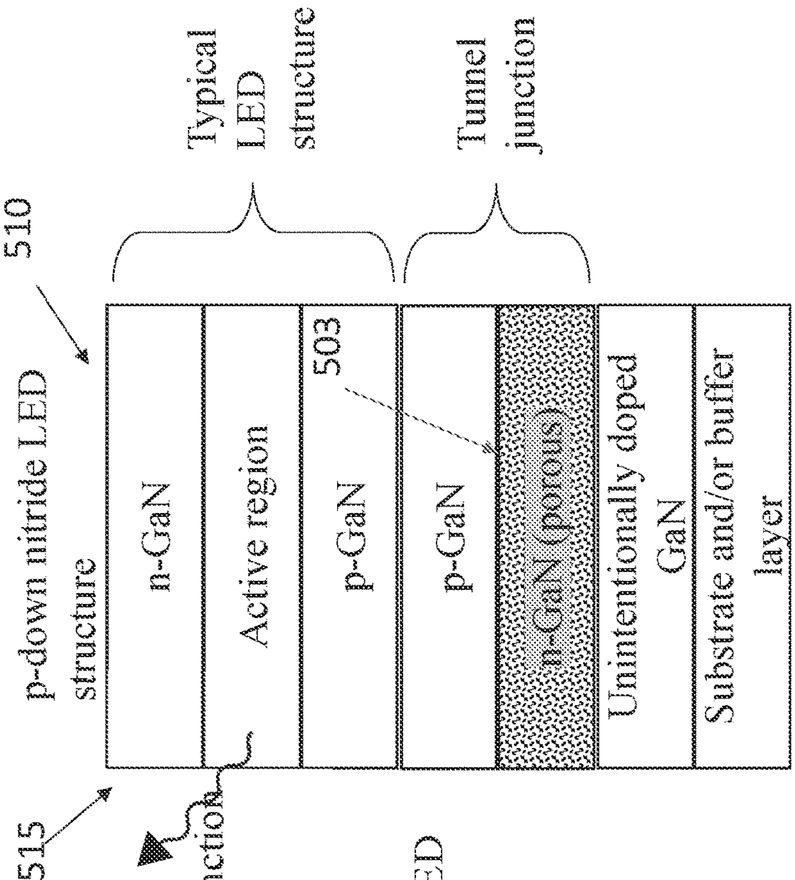
Figure 5C:
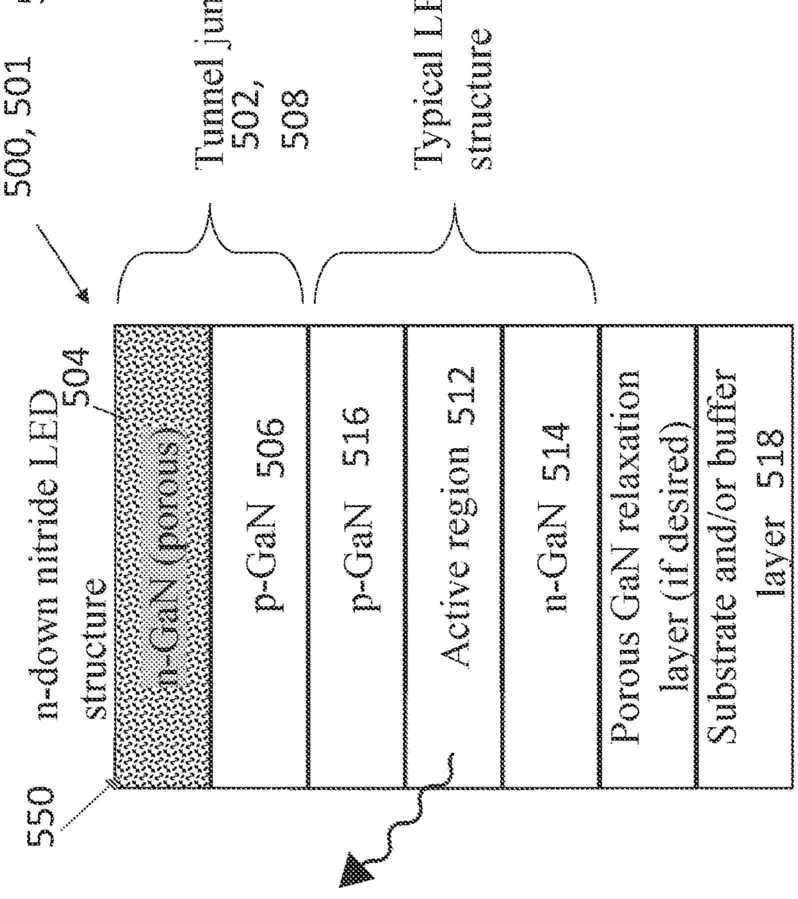
Figure 6A:
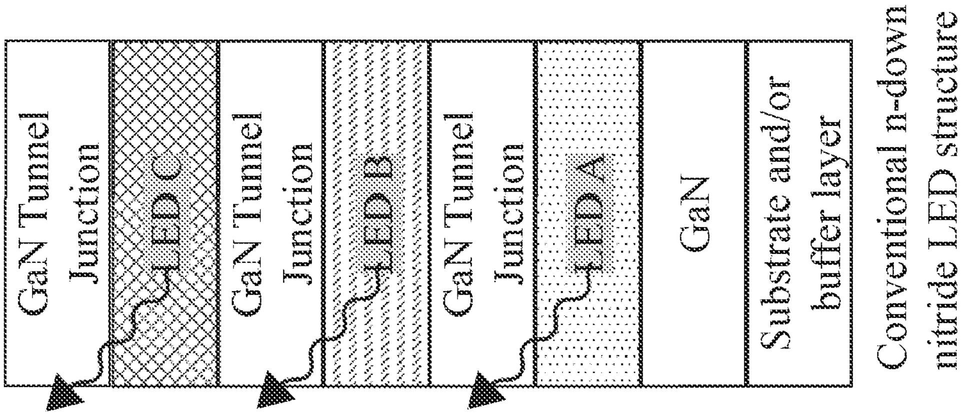
Fig. 6A Prior Art
FIG. 6A-6D shows a more generalized case of the epitaxial stack represented in FIGS. 5A-5D.
Figure 6B:
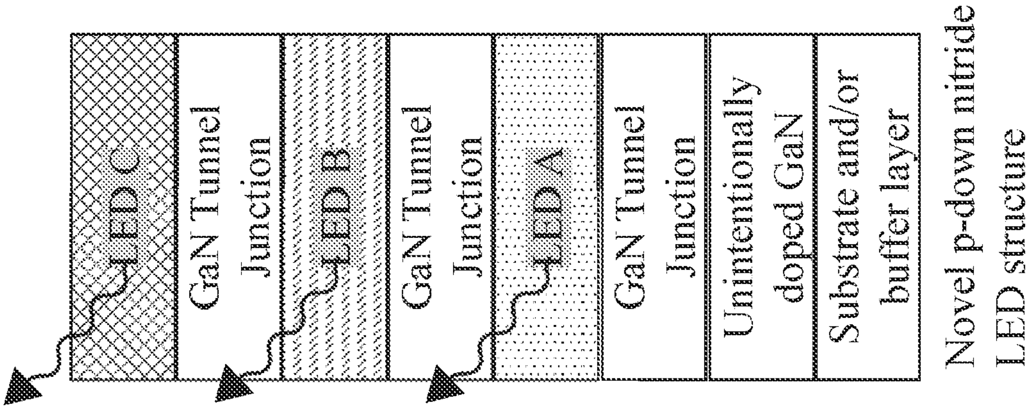
Figure 6D:
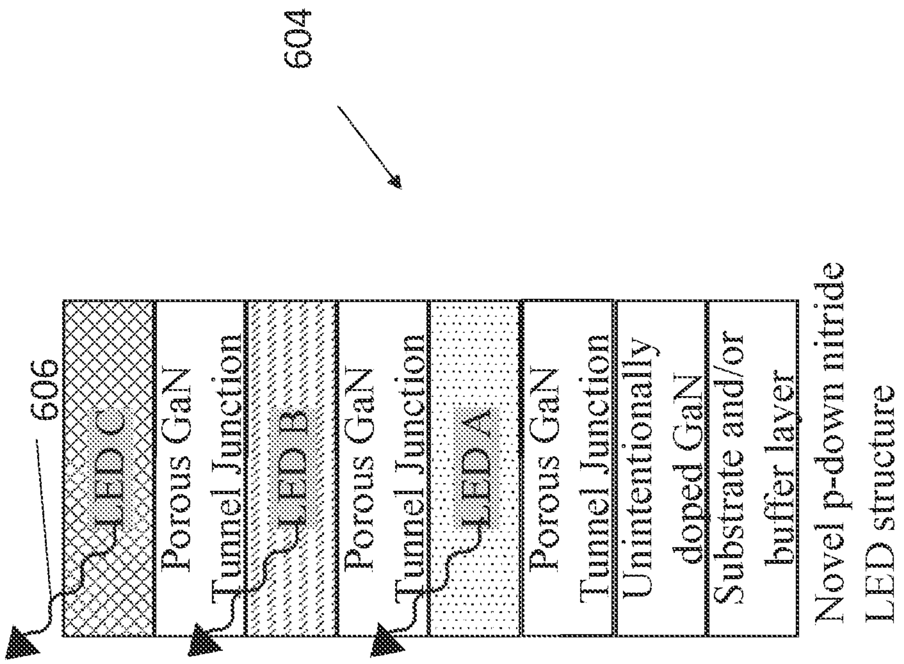
Figure 6C:
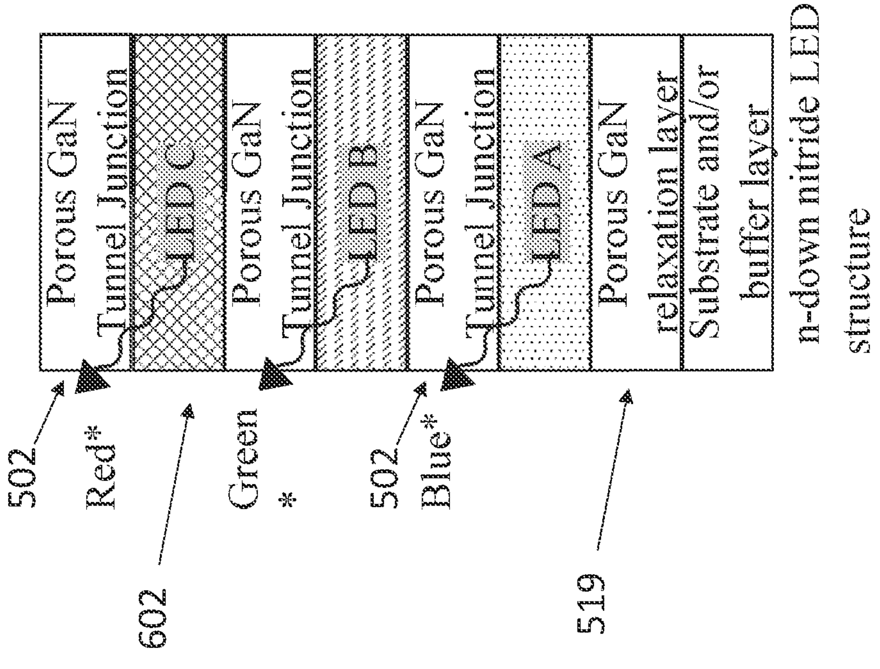

FIG. 4 is a flowchart that illustrates the steps for the production of a monolithic multicolor stacked-diode device, according to one embodiment of the present invention. The description in FIG. 4 applies to the preferred embodiment of a GaN-based red, green, and blue multi-LED structure. However, this method can be adapted for use in a multi-LED stack with any desired number of LEDs, emitting at any desired wavelength. Where relevant, steps referring specifically to "GaN" are to be understood as referring, in the general case, to any material within the (Al,Ga,In,B)N nitride alloy system, as may be desired for applications in other wavelength regimes ranging from the infrared to the ultraviolet.

Blocks 400 and 402 represent the loading of the desired substrate into the growth reactor and the growth of a suitable "buffer layer" needed for the growth of high-quality LED structures. Specifically, Block 400 represents loading the desired substrate such as silicon, sapphire, silicon carbide, or free standing nitride substrate, into the growth chamber. In the preferred embodiment, a sapphire or silicon substrate is loaded into an MOCVD reactor. Block 402 represents growing the necessary buffer layers needed for high-quality epitaxy as desired. In the case of sapphire or silicon, methods for growing high quality buffer layers are well understood and can be readily found in the academic literature. If desired, an n-GaN layer can be grown to be made into a porous GaN stress relaxation layer.

Blocks 404-408 represent the growth of an LED structure in the conventional way. In the case of a novel p-down or any other novel structure, these steps may be modified or taken in any preferred order as needed.

Block 404 represents growing the n-type doped layer or multilayer desired for the LED structure. For instance, an n-GaN layer possibly including some InGaN/GaN superlattice structure may be used.

Block 406 represents growing the LED active region of the desired wavelength. In the preferred embodiment, the targeted emission wavelengths are: blue for the first layer, green for the second layer, and red for the third layer. However any number of different LED active region wavelengths may be grown as needed. This active region may include emitting layers, quantum barrier layers, electron blocking layers, and any other layers deemed necessary for efficient LED operation.

In the preferred embodiment, step 406 refers to the growth of a blue-emitting active region first, followed by a green-emitting active region second, and a red-emitting active region third.

Block 408 represents growing the p-type layers needed for LED operation. This p-type region may comprise p-type GaN, InGaN, or any other nitride alloy, and it may include graded or superlattice structures for enhanced p-type conductivity or LED efficiency Blocks 410 and 412 refer to the growth of a tunnel junction. This tunnel junction may be grown with any number of desired layers including various alloyed and doped layers to optimize tunnel junction efficiency. As in steps 404-408, these steps may be modified or taken in a different order as desired.

Block 410 represents growing the heavily p-type doped GaN tunnel junction layer. If desired, other p-type or n-type or undoped layers may be grown to enhance tunnel junction performance, including various nitride alloys.

Block 4122 represents growing the heavily n-type doped GaN layer to be used both as a tunnel junction layer as well as a porous GaN layer to allow p-type GaN activation. If desired, other p-type or n-type or undoped layers may be grown to enhance tunnel junction performance, including various nitride alloys. However, the heavily n-type doped nitride layer is required, because it will be used as a porous layer to allow activation of Mg doped layers.

In the preferred embodiment, for a conventional n-down structure, steps 404-408 should be completed first, followed by steps 410-412. Then, that sequence is to be repeated twice, until three LEDs have been grown, separated by tunnel junctions. In each iteration, steps may be modified as needed, or taken in any preferred order. For instance, in each iteration, the active region emission wavelength may be changed; in the preferred embodiment, the active regions (steps 406) should have emission wavelengths corresponding to blue first, then green, then red. In the case of a p-down, or any other desired novel device structure, the order and number of repetitions of these steps may be modified.

Note: Steps 400-408 comprise the growth of an individual LED structure. Steps 410-412 comprise the growth of an individual tunnel junction structure. In the preferred embodiment, the following growth sequence is to be followed: 400, 402, 404, 406, 408, 412, 414, 404, 406, 408, 412, 414, 404, 406, 408, 412, 414 and so on.

For growth of a p-down structure, this sequence could be modified in a straightforward way: 400, 402, 410, 408, 406, 404, 412, 410, 408, 406, 404, 412, 410, 408, 406, 404 and so on.

If more or fewer than three LEDs are desired, this method may be modified as needed.

The processing steps, 414-420, may be carried out in any desired order including the addition or omission or repetition of steps as desired.

Blocks 414-420 represent the processing of the completed epitaxial sample into a device.

Block 414 represents unloading the sample from the MOCVD reactor.

Block 416 represents LED processing, using whichever fabrication techniques are needed for the desired application. This process may comprise the fabrication of a downward emitting LED structure with a transparent substrate. In alternative embodiments, it may comprise a top emitting device. Devices may be operated while on the growth substrate, or transferred onto another substrate.

Block 418 represents preparing the sample with electrodes on the heavily n++ doped regions, and prepare an electrolyte solution of, e.g. 0.3M oxalic acid at room temperature. Contact the electrolyte solution with a Pt electrode, and apply a voltage of, e.g. 20V to the sample to complete the GaN porosification process. The voltage for the electrochemical etch is applied between one electrode in the electrolyte bath and the other electrode comprising the metal contact 800 to the n-type layer being etched to form the n-type porous layer (contact 800 illustrated in FIG. 7, FIG. 8, and FIG. 9).

Roles of porous n-GaN include (1) forming the tunnel junction with p-GaN, (2) removal of hydrogen through porous GaN for p-type activation, and (3) strain relaxation of LED layers, if desired.

Block 420 represents activating the Mg doped layers with thermal annealing.

Block 422 represents the end result, a stacked-diode LED. In the preferred embodiment, an individually controllable red, green, and blue pixel array results. In one possible embodiment, this pixel array can be used as a monolithically grown display on a transparent sapphire substrate. As shown in FIG. 6, diodes can be individually controlled. Applying a nonzero voltage for V1-V2 activates the topmost (red) diode, for V2-V3 activates the middle (green) diode, and for V3-V4 activates the bottom (blue) diode. In the preferred embodiment, although any other wavelength or number of stacked diodes may be used.

The steps may be completed in any order, and steps may be added, omitted, or repeated as desired. In the preferred embodiment, the steps are to be taken in the numerical order as presented in FIG. 4. After step 420, additional processing (step 416) may be needed.

Figure 7:
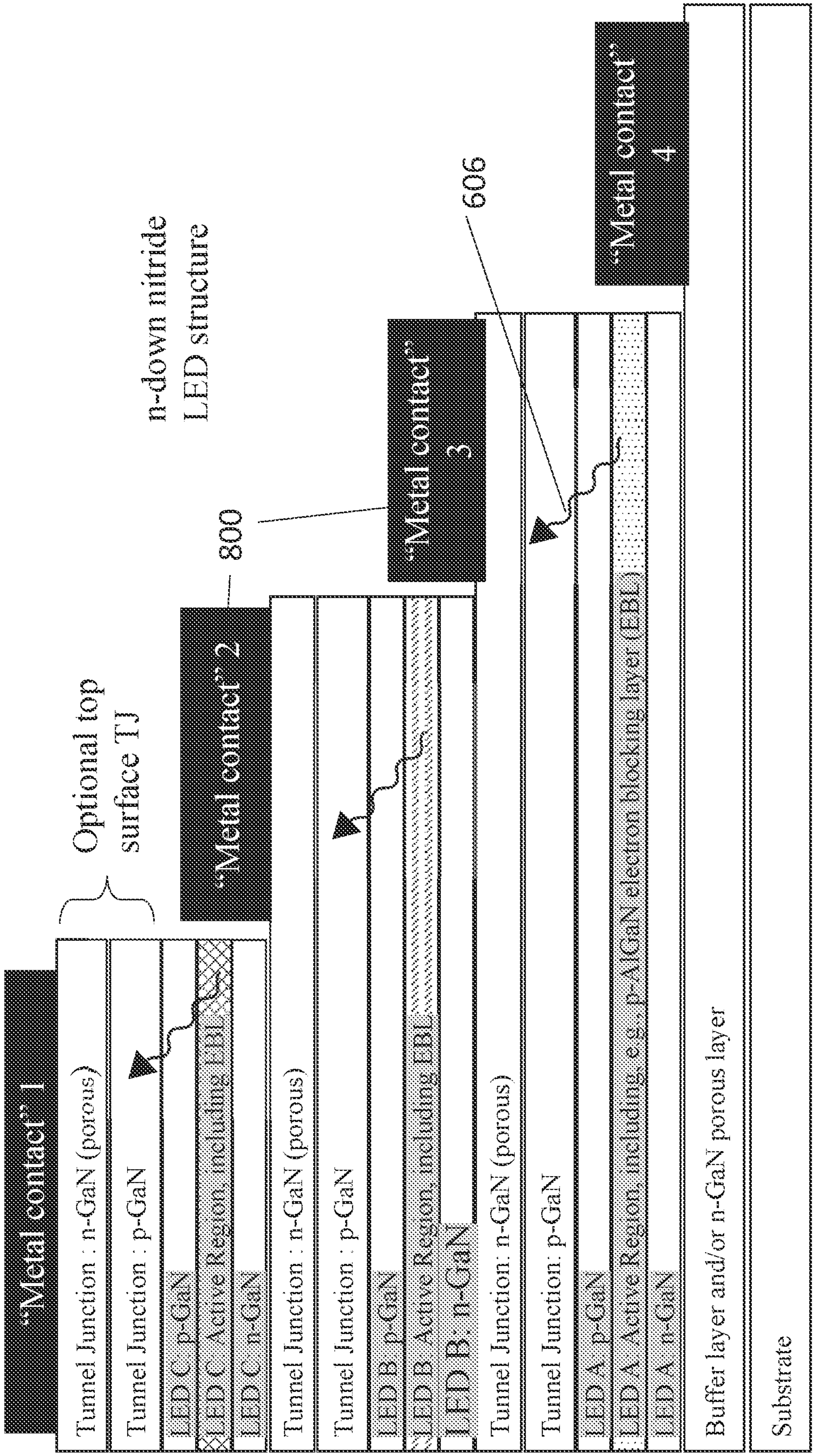
FIG. 7 shows a more detailed epitaxial layer structure. This schematic is not meant to cover all details of a multi-LED stack exhaustively, but simply to serve as a representation of the type of device which might be grown. It is to be understood that the complex multilayered structures comprising, e.g., an "active region" of an LED, are suppressed here for clarity, and would be present in a real device. A conventional n-down structure with a porous GaN stress relaxation layer is shown, although any number of variations on this basic device structure could be produced. The "Metal contact" areas may comprise many different types of contacts depending on the desired device architecture and application, as detailed in FIG. 8.

FIG. 7 illustrates a device including metal contacts for electrically contacting the device.

Figure 8:
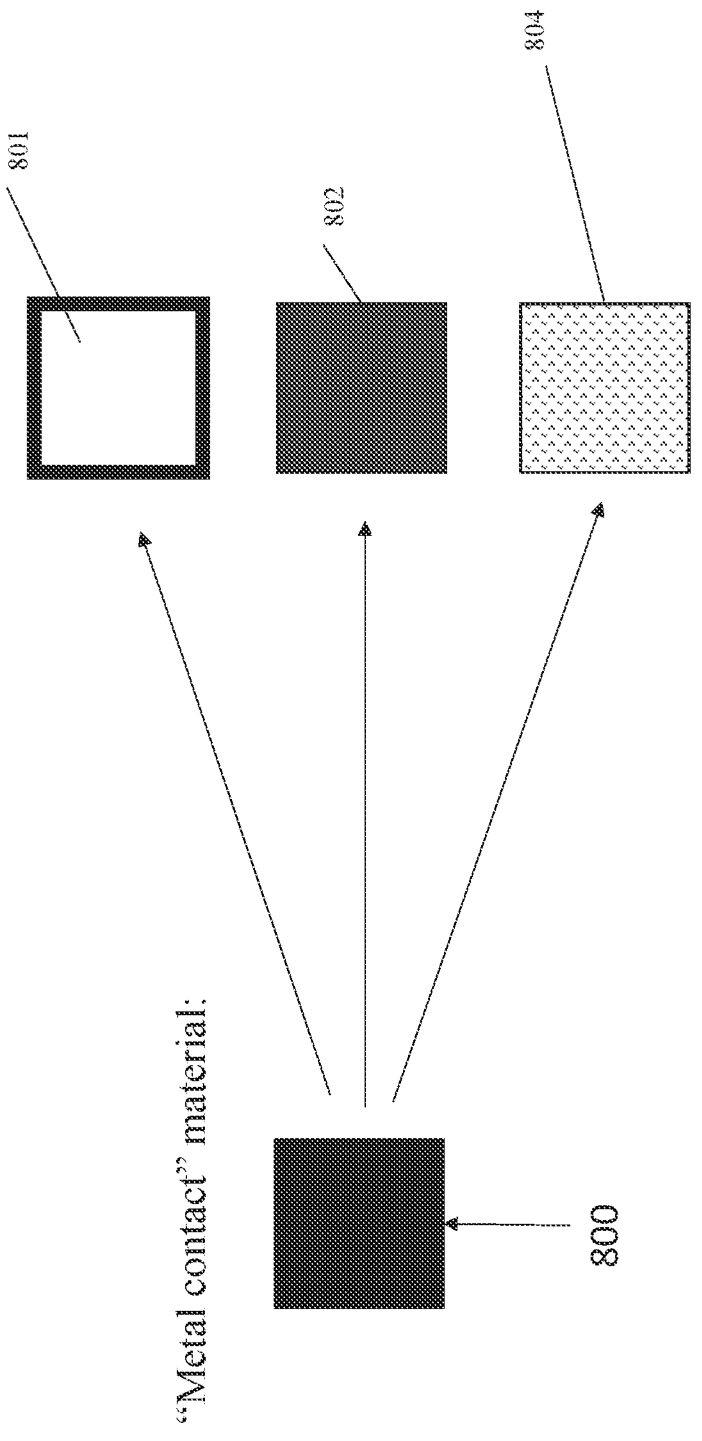
FIG. 8 describes some possible examples of contact structures for driving the LED structures. For top emitting structures, a transparent contact such as a conductive n-GaN window, or a conventional transparent conducting contact such as ITO can be used. In the case of a bottom emitting structure, a metal contact or mirror contact can be used. If a flip-chip device is desired, metal contacts including bonding metal such as Au, or In/Au, or any other bonding metal, can be used. Mirror structures such as DBRs including porous-GaN DBRs may be used.
Figure 9B:
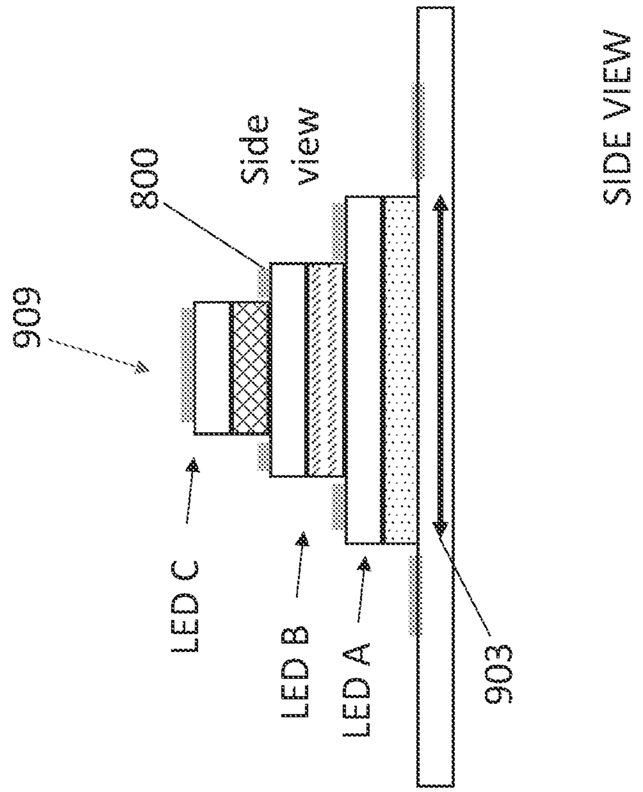
FIG. 9A-9D represents two possible device geometries making use of a stacked diode structure, as outlined in FIG. 7. A concentric (FIG. 9A-9B) structure comprises multiple LEDs sharing some common contacts, and can be implemented to minimize pixel size (FIG. 9A top view, FIG. 9B side view). If a larger pixel pitch can be accommodated, the sub-pixel design (FIG. 9C-9D) can be implemented, maximizing device efficiency and minimizing intermixing and self-absorption (FIG. 9C top view, FIG. 9D side view). Both device types, and many others, are possible using the same stacked-diode multilayer structure.
Figure 9A:
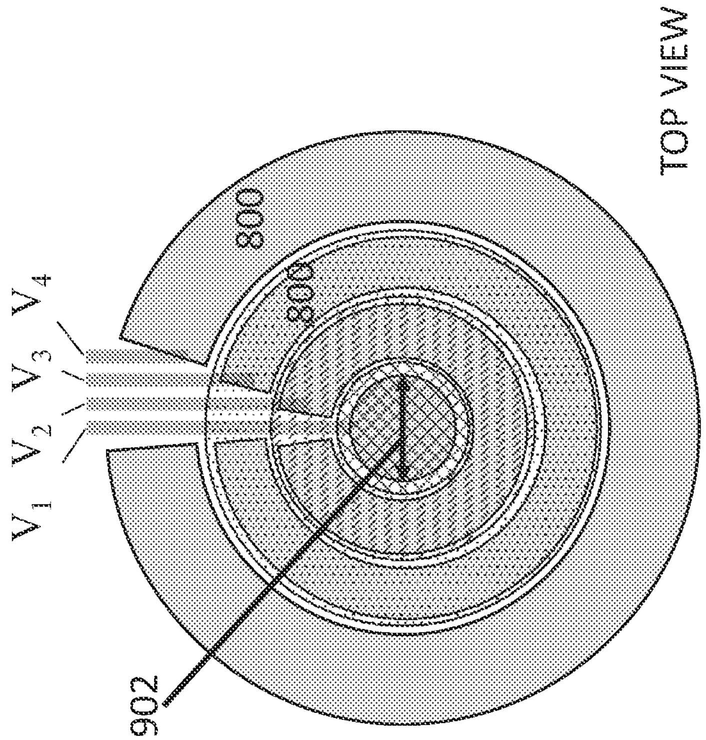
Figure 9D:
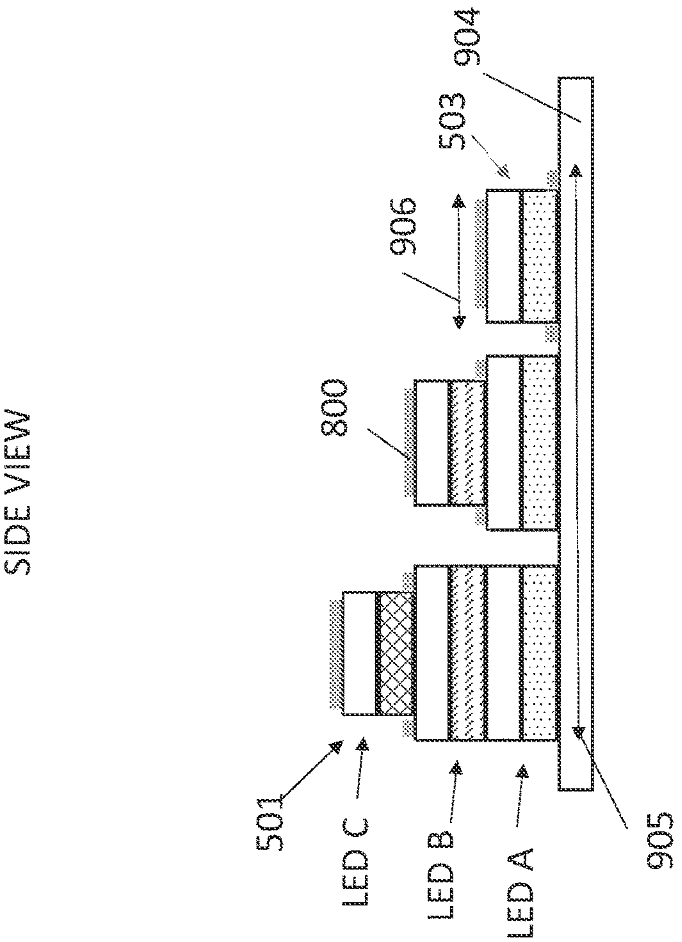
Figure 9C:
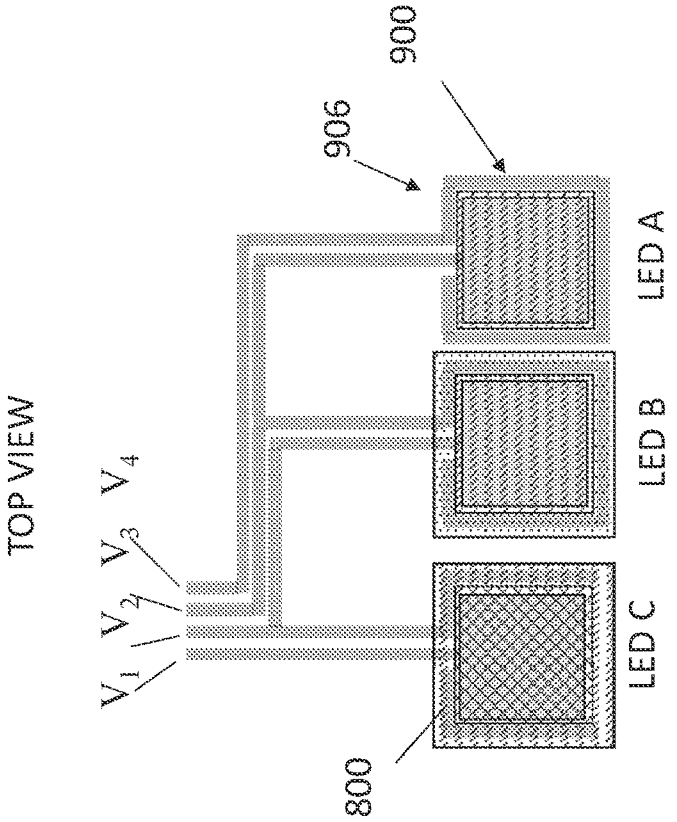

FIG. 8 illustrates different metal contact 800 materials for contacting the device. The metal contact materials can comprise a window shaped metal contact 801 with n-GaN tunnel junction current spreading layer for topside emission, an opaque metal contact or mirror contact 802 for downward emission, either through transparent substrate or in thin-film flip chip architecture (metallic contact can also be used for wafer bonding or other forms of mass transfer) or a conventional transparent contact layer 804 such as ITO.

FIGS. 9A-9D represent two possible device geometries making use of a stacked diode structure, as outlined in FIG. 7. A concentric structure (FIG. 9A-9B) comprises multiple LEDs sharing some common contacts, and can be implemented to minimize pixel 900 size. In one or more examples, the central or top most diode (LED C) has a maximum diameter 902 of 1 micrometer or less or 500 nm or less and the bottom diode (LED) has a maximum diameter 903 of 3 micrometers or less. If a larger pixel pitch can be accommodated, the sub-pixel design (FIG. 9C and FIG. 9D) can be implemented, maximizing device efficiency and minimizing intermixing and self-absorption. In one or more examples, each LED has a maximum width 906 or diameter of 1 micron or less and in the case of non stacked LEDs 503 (i.e., each LED 503 emitting one color selected from red, blue or green) placed next to each other, the sub pixel comprising 3 LEDs 503 has a width 905 of 5-10 microns.

Both device types, and many others, are possible using the same stacked-diode multilayer structure on a substrate 904. Note this schematic does not show all epitaxial layers. See FIG. 4 for details of epi stack, and precise location of metal contacts, porous layers, tunnel junctions, and active regions. The LEDs 503, 501, LEDA, LED B, LEDC can be monolithically (e.g., epitaxially) grown on a growth substrate 904. In one or more examples, the LEDs all comprise III-Nitride materials with active regions of LEDs A, B, and C having different indium content to achieve blue, green, and red light emission. In other examples, substrate 904 comprises a host substrate and LEDs are wafer bonded to the host substrate.

Figure 10:
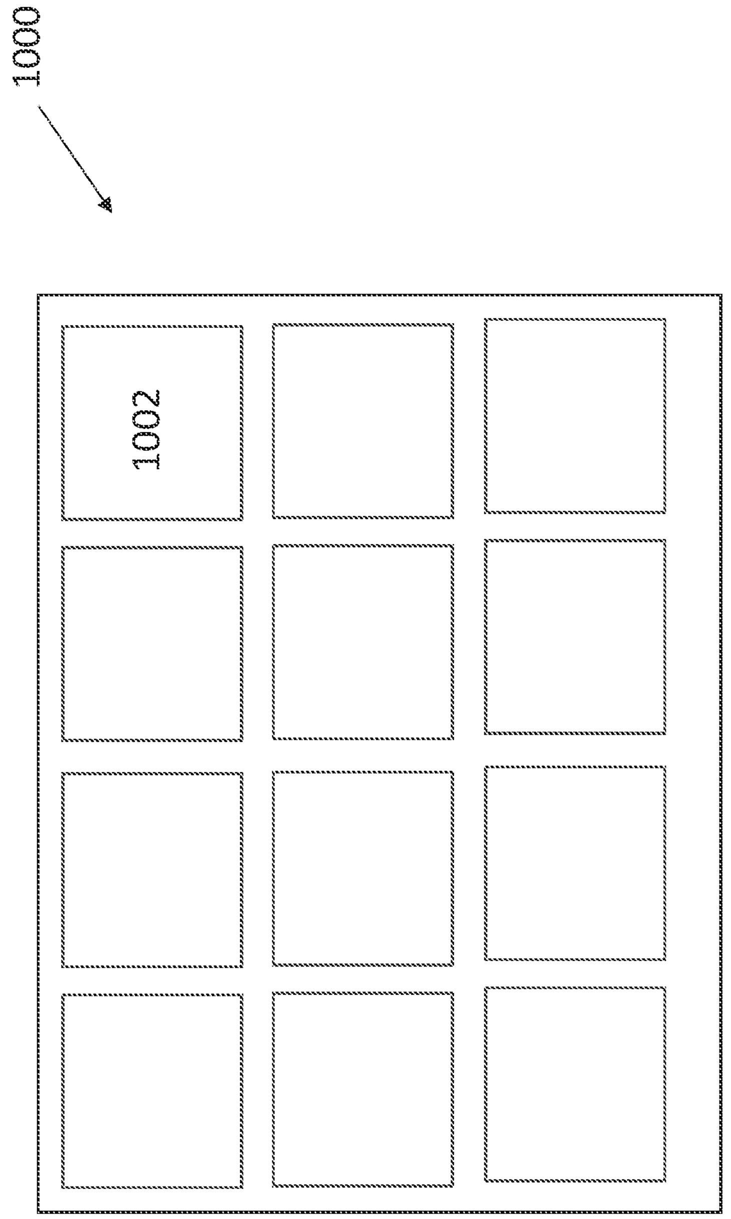
FIG. 10 illustrates a display comprising a pixel or sub pixel including a stacked diode structure.

FIG. 10 illustrates a display 1000 comprising a pixel 1002 or sub pixel 1002 including a stacked diode structure 501. In one or more examples, each pixel comprises a red light emitting diode (e.g., LED C), a green light emitting diode (LED B), and a blue light emitting diode (LED A). In one or more examples, the light emitting layer comprises one monolithic material system, e.g., that has not been fabricated using a pick and place process.

c. Possible Modifications and Variations

The stacked LED structure can be processed and fabricated in many different ways, and on many different substrates, depending on the application or other factors. For example, the monolithic LED stacks could be grown on a transparent sapphire substrate, and then processed into a downward emitting structure with mirror contacts, forming a monolithic sapphire display without the need for any flip-chip or mass transfer. As another possible example, the LED stack could be grown on an inexpensive silicon substrate, and then mass-transferred onto another substrate. In the preferred embodiment, the multi-LED stack comprises three active regions, emitting in red, green, and blue wavelengths. However, other embodiments are possible, such as a stack of several blue LED active regions, which may or may not need to be individually addressable, and could be used in lighting applications where high-voltage, low current density operation (where LED efficiency is higher) is desired.

While a nitride LED with a tunnel junction has been described, it is to be understood that similar methods can be applied to any nitride device with a buried p-n junction such as a tunnel junction or any other type of buried junction.

The present invention is not limited to devices grown or fabricated using III-Nitride materials. In other examples, the n-type porous layer comprises a semiconductor material from a III-V material system.

Electrochemical processing conditions (e.g., temperature of electrolyte bath, voltage applied to the electrodes during etching, etching duration), the electrolyte composition, and the electrode composition can be tailored depending on the material of the n-type layer being etched (porosified). Example n-type layers include, but are not limited to, GaN, AlGaN, and InGaN. In one example wherein the n-type layer comprises AlGaN, the electrolyte comprises nitric acid ($HNO_3$), the electrode in the bath comprises silver and the metal contact to the porous layer comprises or consists of at least one of aluminum, titanium, or vanadium (e.g., Al, Ti/Al, or V/Al) depending on the aluminum content in the AlGaN. In another example wherein the n-type layer comprises GaN, the metal contact to the n-type layer comprises or consists of at least one of titanium or aluminum. In one or more examples, the metal contact 800 comprises or consists of Al or Ti/Al.

d. Device Embodiments

Figure 11:
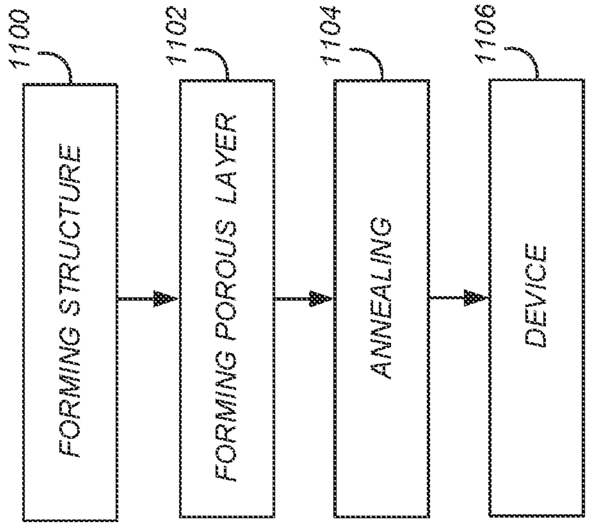
FIG. 11 is a flowchart illustrating a method of making a device.

FIG. 11 is a flowchart illustrating a method of making a device.

Block 1100 represents forming one or more structures each including a p-type layer adjacent to an n-type layer. In one example, the step comprises depositing an n-type layer atop a p-type layer so as to form a tunnel junction between the n-type layer and the p-type layer. In one or more examples, the p-type layer comprises an as-grown acceptor doped layer.

Block 1102 represents forming pores in the n-type layer. In one or more examples, the step comprises electrochemical etching pores or voids in the n-type layer so as to form the porous layer after formation of the structure or deposition of the n-type layer.

Block 1104 represents optionally removing hydrogen from inside the p-type layer and at least partially through the porous layer. In one or more examples, the removing comprises thermally annealing the device with an ambient gas comprising at least some air, oxygen, water, or mixed gases. In one or more examples, the thermal annealing is at a temperature higher than 300° C.

Block 1106 represents the end result, a device. Examples include, but are not limited to, the following.

1. FIGS. 5C-5D, FIG. 6C-6D and FIG. 7, FIG. 8, FIG. 9, and FIG. 10 illustrate a (e.g., III-nitride based) device 500 (e.g., LED 501), comprising:

one or more tunnel junctions 502 each formed by an n-type layer 504 deposited atop a p-type layer 506, wherein the n-type layer is a porous layer.

2. A (e.g., III-nitride based) device 500, comprising:
one or more structures 508 each including a p-type layer 506 adjacent to an n-type layer 504, wherein the n-type layer is a porous layer.

3. A device 500, comprising:
III-nitride layers 510 including:
an active region 512 between an n-type layer 514 and a p-type layer 516, 506; and
a porous n-type layer 504 on or above the p-type layer 506, wherein the porous n-type layer 504 forms a tunnel junction 502 with the p-type layer 506.

4. The device of any of the examples 1-3, wherein the porous n-type layer 504 is made into the porous layer by electrochemical etching so as to form an electrochemically etched porous n-type layer.

5. The device of any of the examples 1-4, wherein the p-type layer 506 comprises an as-grown acceptor doped layer further processed by removing hydrogen from inside the p-type layer 506 and at least partially through the porous layer.

6. The device of example 5, wherein the as-grown acceptor doped layer is doped with an acceptor and the acceptor is magnesium.

7. The device of examples 5 or 6, wherein the hydrogen is removed using thermal annealing of the device, with an ambient gas comprising at least some air, oxygen, water, or mixed gases.

8. The device of example 7, wherein the thermal annealing is at a temperature higher than 300° C.

9. The device of any of the examples 1-8, wherein the porous n-type layer 504 and the p-type layer 506 comprise GaN, AlGaN, InGaN, or any other nitride alloy (Al,Ga,In,B)N.

10. The device of any of the examples 1-9, wherein:
a concentration of donors in the porous n-type layer 504 is greater than $10^{17}$ $cm^{-3}$, and
the donors comprise Si, Ge, or other impurities.

11. The device of example 10, wherein the concentration of donors in the porous n-type layer 504 is greater than $10^{18}$ $cm^{-3}$.

12. The device of the example 11, wherein the concentration of donors in the porous n-type layer 504 is greater than $10^{19}$ $cm^{-3}$.

13. The device of any of the examples 10-12, further comprising one or more n-type tunnel junction layers 515 including the porous n-type layer 504, wherein a concentration of Ge in the one or more n-type tunnel junction layers is greater than $10^{17}$ $cm^{-3}$.

14. The device of any of the examples 1-13, wherein the device is grown on a c-plane oriented substrate 518.

15. The device of any of the examples 1-13, wherein the device is grown on an m-plane or other nonpolar oriented substrate 518.

16. The device of any of the examples 1-13, wherein the device is grown on a semipolar oriented substrate 518.

17. The device of any of the examples 1-13, wherein the device is grown on a sapphire substrate 518.

18. The device of any of the examples 1-13, wherein the device is grown on a silicon substrate 518.

19. The device of any of the examples 1-13, wherein the device is grown on a silicon carbide substrate 518.

20. The device of any of the examples 1-13, wherein the device is grown on a free-standing GaN substrate 518.

21. The device of any of the examples 1-13, wherein the device is grown on a free-standing AlN substrate 518.

22. The device of any of the examples 1-20, wherein the device is grown on a relaxed alloy substrate 518 comprising a relaxed alloy on a foreign substrate, wherein the relaxed alloy comprises InGaN or other III-Nitride and the foreign substrate comprises sapphire or another material different from III-Nitride.

23. The device of any of the examples 1-22, wherein the p-type layer 506 is buried by the porous n-type layer 504.

24. The device of any of the examples 1-22, comprising a plurality of the tunnel junction structures 502, 508.

25. The device of any of the examples 1-24 comprising one or more light emitting diodes (LEDs) 501.

26. The device of example 25, comprising a plurality of LED structures 602 grown in the same vertical layer stack 604, wherein one of the tunnel junctions 502 separates each of the LED structures.

27. The device of example 26, comprising at least three of the LED structures 602, each of the three LED structures emitting at a different wavelength.

28. The device of example 27, wherein the at least three LED structures emit wavelengths corresponding to blue, green, and red light 606, respectively. In one or more examples, the at least three LED structures LEDA, LEDB, and LEDC emit wavelengths corresponding to blue, green, and red light, respectively, one of the tunnel junctions 502 is between LED A and LED B, another of the tunnel junctions 502 is between LED B and LED C, and yet another of the tunnel junctions 502 is on LED C.

29. The device of any of the examples 25-28, wherein each of the LEDs can be individually electrically driven, so as to produce a mixture of various wavelengths of light with controllable brightness.

30. The device of any of the examples 1-29, wherein the porous n-type layer is a stress reduction layer 519.

31. FIG. 10 illustrates a display 1000 (e.g., a monolithically integrated display) comprising the light emitting diodes 501 of any of the examples 25-30.

32. A display 1000 comprising the light emitting diodes 501 of any of the examples 25-31, wherein the display is formed or grown on a transparent sapphire substrate or other transparent substrate 904, such that the preferred light emission direction from the LEDs is downward through the transparent substrate 904.

33. A display comprising the light emitting diodes of any of the examples 25-32, wherein the light emitting diodes are fabricated as top emitting devices emitting light only through a top surface 909 of the LEDs.

34. The device of any of the examples 25-33, wherein the light emitting diodes comprise stacked diode devices 500 that are mass-transferred onto a new substrate 904 selected from a silicon, sapphire, glass substrate, other transparent substrate, or other non-transparent substrate.

35. The device of any of the examples 25-34, further comprising ohmic contacts to the LED structures that also form metal bonding pads 801 for wafer bonding, wherein the ohmic contacts comprise Au, In/Au, or any other bonding metal.

36. The device of examples 25-35, further comprising a reflective mirror structure 804 connected to the LED structures.

37. The device of example 36, wherein the reflective mirror structure is a Distributed Bragg Reflector (DBR).

38. The device of example 37, wherein the DBR comprises alternating layers of porous- and nonporous III-nitride.

39. The device of example 38, wherein the DBR comprises alternating layers of porous and non-porous gallium nitride.

40. A method of making a III-nitride based device, comprising:

depositing an n-type layer 504 atop a p-type layer 506 so as to form a tunnel junction 502 between the n-type layer and the p-type layer, wherein the n-type layer is a porous layer.

41. A method of making a III-nitride based device, comprising:

forming one or more structures 508 each including a p-type layer 506 adjacent to an n-type layer 504, wherein the n-type layer is a porous layer.

42. The method of examples 40 or 41, further comprising electrochemical etching pores 550 or voids in the n-type layer so as to form the porous layer after formation of the structure or deposition of the n-type layer.

43. The method of any of the examples 40-42, comprising:

forming the n-type layer 515 on the p-type layer 506 comprising an as-grown acceptor doped layer; and removing hydrogen from inside the p-type layer 506 and at least partially through the porous layer 504.

44. The method of example 43, wherein the removing comprises thermally annealing the device with an ambient gas comprising at least some air, oxygen, water, or mixed gases.

45. The method of example 44, wherein thermal annealing is at a temperature higher than 300° C.

46. The device of examples 1-3 and 9-39 fabricated using the method of any of the examples 40-45.

47. The device or method of any of the examples 1-46, wherein the porous layer comprises pores or voids having a diameter in a range of 0.1-1000 micrometers.

48. The device or method of any of the examples 1-47, wherein the porous layer comprises a density of pores or voids 550 sufficient to allow hydrogen to escape from the p-type layer 506 and activate (or thereby activating) the p-type layer 506.

49. The device or method of any of the examples 1-48, wherein the device is a III-nitride based device.

50. The device or method of any of the examples 1-49, wherein the n-type layer, p-type layer, active region, and optional electron blocking layer comprise III-Nitride.

51. The device or method of example 50 or 49, wherein the active region comprises InGaN with an indium content tailored for emission of light having the desired wavelength.

52. The device or method of example 50 or 49, comprising multiple stacked LEDs LEDA, LEDB, LEDC each separated by a tunnel junction, wherein the active region of LEDA has the indium content for emitting blue light, the active region of LEDB has the indium content selected for emission of green light, and the active region of LEDC has the indium content selected for emission of red light.

53. The device or method of example 50 or 49, comprising multiple stacked LED each separated by a tunnel junction and each having an active region comprising InGaN with a different indium content.

54. The device or method of any of the examples 1-50 wherein the device is a semiconductor or III-V device (e.g., the device comprises n-type layer(s) (including porous n-type layer), p-type layer(s), and active region comprising a semiconductor or III-V material layers).

Advantages and Improvements

The present invention discloses the method of producing a monolithic multi-LED stacked diode device with porous-GaN enabled tunnel junctions separating the stacked diodes, as well as a device produced thereby. The present invention also discloses a preferred device design in which the stacked LED comprises three diodes emitting red, green, and blue light, lithographically processed so as to have individually addressable colored LEDs monolithically integrated on a single substrate. In the preferred device, the devices are grown on a transparent sapphire substrate, so that a fully monolithically integrated red, green, blue pixel array or "display" results. In another possible embodiment, the LEDs may be grown on any desired substrate such as sapphire, silicon, silicon carbide, free standing nitride substrate, or any other substrate, and then the LEDs may be transferred onto another substrate to form a display or other desired device application.

Previous methods for producing stacked LED structures, or any tunnel junction structures for that matter, are complicated by the difficulty of activating MOCVD grown magnesium doped nitride p-type regions. These regions (in the preferred embodiment, p-GaN) must be exposed to a free surface in order to be activated by thermal annealing, whereby hydrogen atoms are free to diffuse out of the material. Thus, stacked-diode structures separated by tunnel junctions are most effectively grown by MBE, although this method is costly and cumbersome does not produce highly efficient LEDs. In MOCVD grown material, buried p-GaN can only be activated if 1) the device size is very small, on the order of 10 micrometers or less, or 2) the device is specially patterned in such a way as the enable p-GaN activation through small holes in the layers lying on top. Both of those methods impose limitations of device performance and design space, and are not shown to be very effective for p-GaN activation. For example, micro-LED structures fabricated using these methods are too small to emit with significant power needed for, e.g., display applications.

The advantage of the method disclosed herein is that the porous GaN buried p-n junction method allows buried p-type layers to be activated without any changes to device design, because the adjacent porous n-GaN structure allows efficient gas exchange between the adjacent p-GaN and the atmosphere. Therefore, this device structure is expected to be vital to realizing stacked diode LED devices (in the preferred embodiment, multi-color individually controllable pixels for display applications) grown by MOCVD.

In addition, such a stacked device can be used to produce a high-power LED by reducing the driving current density needed to emit at a particular power. Furthermore, if desired, the stacked diodes may emit at different wavelengths and powered independently, so as to produce a "pixel" or multicolored LED capable of emitting any color using red, green, and blue (RGB) color mixing. Other colors could also be used.

The tunnel junction comprising a porous n-type layer enables multiple stacked LEDs to be formed monolithically (e.g., epitaxially) on a common substrate. This could not previously be achieved because buried p-type region could not be accessed for activation (i.e., hydrogen could not be removed from the buried p-type layer so as to activate the hydrogen). The porous n-type layer(s) in the tunnel junction described herein enables the buried p-type regions in the vertical stacked structure (comprising LEDA, LEDB, and LEDC) to be accessed and activated (e.g., by allowing removal of hydrogen from the p-type layer(s) 506 through the porous n-type layer 504).

The present disclosure has also discovered a synergy between the doping level of the n-type layer 504 needed for tunneling across the tunnel junction 502 and the doping level of the n-type layer 504 needed for the porosification (process of making porous) using electrochemical etching. Specifically, the doping level needed for tunneling is also effective for enhancing the creation of the pores using the electrochemical etching. Increasing the amount of n-type doping increases the amount of porosification (e.g., increasing size of pores and/or the etch rate) and can be tailored together with other process parameters used during the electrochemical etching. In one or more examples, the n-type dopant density in the n-type layer is in a range of $1\times10^{18}$ $cm^{-3}$ to $5\times10^{20}$ $cm^{-3}$. In some examples, the n-type dopant level is increased to remove substantial portions of the n-type layer during the porosification process, so that the n-type porous layer comprises a sacrificial layer.

3. Nomenclature

As used herein, the term "III-nitride," or more simply "nitride," refers to any alloy composition of the (Ga,Al,In,B)N semiconductors having the formula $Ga_nAl_xIn_yB_zN$ where:

$$0 \le n \le 1,\ 0 \le x \le 1,\ 0 \le y \le 1,\ 0 \le z \le 1, \text{ and } n+x+y+z=1.$$

The III-nitride layers may be comprised of a single or multiple layers having varying or graded compositions, including layers of dissimilar (Al,Ga,In,B)N composition. Moreover, the layers may also be doped with elements such as silicon (Si), germanium (Ge), magnesium (Mg), boron (B), iron (Fe), oxygen (O), and zinc (Zn).

The III-nitride layers may be grown in any crystallographic direction such as on a conventional polar c-plane or on a nonpolar plane, such as an a-plane or m-plane, or on any semipolar plane, such as {20-21}, {20-2-1}, {11-22} or {10-11}.

The III-nitride layers may be grown using deposition methods comprising metalorganic chemical vapor deposition (MOCVD), hydride vapor phase epitaxy (HVPE) or molecular beam epitaxy (MBE).

Similarly III-V materials or devices are equivalent and broadly construed to include respective compounds or compositions comprising Group III and Group V species, e.g., but not limited to, binary, ternary and quaternary compositions of such Group III species combined with Group V species, where Group III, III, Group V, V refer to groups in the periodic table of the elements. Thus, the devices and methods described herein with respect to III-Nitride devices could also be implemented as III-V devices more generally.

REFERENCES

The following references are incorporated by reference herein.

[1] Y. Zhang et al., "A conductivity-based selective etching for next generation GaN devices," *Phys. Status Solidi Basic Res.*, vol. 247, no. 7, pp. 1713-1716, 2010.

[2] S. S. Pasayat et al., "Fabrication of relaxed InGaN pseudo-substrates composed of micron-sized pattern arrays with high fill factors using porous GaN," *Semicond. Sci. Technol.*, vol. 34, no. 115020, 2019.

[3] U.S. Pat. No. 7,095,052 B2.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A III-nitride based device, comprising:

a plurality of light emitting devices (LED) with p-type layer activation stacked one on top of the other, each of the LEDs comprising a tunnel junction formed by an n-type layer deposited atop a p-type layer, wherein the n-type layer is etched to form etched surfaces providing access for the activation of the p-type layer and deposition of a metal contact for injection of current to independently control emission of each of the LEDs, the device comprising a staircase or cascaded structure with the metal contact on each of the ledges of the staircase or cascaded structure.

2. The device of claim 1, wherein the LEDs each further comprise

III-nitride layers including an active region between an n-type layer and the p-type layer.

3. The III-nitride based device of claim 1, wherein the n-type layer is a porous layer.

4. The III-nitride based device of claim 1, wherein the n-type layer and the p-type layer comprise GaN, AlGaN, InGaN, or any other nitride alloy (Al,Ga,In,B)N.

5. The III-nitride based device of claim 4, wherein the concentration of donors in the persons n-type layer is greater than $10^{18}$ $cm^{-3}$.

6. The III-nitride based device of claim 1, wherein:

a concentration of donors in the n-type layer is greater than $10^{17}$ $cm^{-3}$, and the donors comprise Si, Ge, or other impurities.

7. The III-nitride based device of claim 6, wherein the concentration of donors in the n-type layer is greater than $10^{19}$ $cm^{-3}$.

8. The III-nitride based device of claim 1, further comprising more n-type tunnel junction layers including the n-type layer, wherein a concentration of Ge in the one or more n-type tunnel junction layers is greater than $10^{17}$ $cm^{-3}$.

9. The III-nitride based device of claim 1, wherein the device is on a c-plane oriented substrate, nonpolar oriented substrate, or semipolar oriented substrate.

10. The III-nitride based device of claim 1, wherein the device is on a sapphire substrate, silicon substrate, silicon carbide substrate, free standing GaN substrate, or free standing AlN substrate.

11. The III-nitride based device of claim 1, wherein the device is on a relaxed alloy substrate comprising a relaxed alloy on a foreign substrate, wherein the relaxed alloy comprises InGaN or other III-Nitride and the foreign substrate comprises sapphire or another material different from III-Nitride.

12. The III-nitride based device of claim 1, further comprising:

a substrate;

a porous layer on or above the substrate; and the LEDS on the porous layer.

13. The III-nitride based device of claim 1, comprising at least three of the LED structures grown in the same vertical layer stack, one of the tunnel junctions separating each of the LED structures, and each of the three LED structures emitting at a different wavelength, wherein:

the at least three LED structures LEDA, LEDB, and LEDC emit wavelengths corresponding to blue, green, and red light, respectively and one of the tunnel junctions is between LED A and LED B, one of the tunnel junctions is between LED B and LED C, one of the tunnel junctions is on LED C.

14. A display comprising the III-Nitride based device of claim 13, wherein the display is formed or grown on a transparent sapphire substrate or other transparent substrate, such that the preferred light emission direction from the LEDs is downward through the transparent substrate.

15. The device of claim 1, wherein the LEDs comprise a blue light emitting LED, a red light emitting LED, and a green light emitting LED and are stacked concentrically on top of each other, with the diameter of the LEDs reducing progressively from the bottom-most one of the LEDs to the topmost one of the LEDs.

16. The device of claim 1, wherein the p-type layers have higher activation as compared to a device where the p-type layers are buried.

17. A display comprising pixels each comprising the device of claim 1, wherein the pixels each comprise sub-pixels comprising a single LED comprising a blue light emitting LED, a stack of two of the LEDs including a green light emitting LED, and a stack of 3 of the LEDs including a red light emitting LED, wherein the sub-pixels are positioned side by side.

18. A method of fabricating a device, comprising:

growing a plurality of light emitting device structures, each of the structures comprising a tunnel junction formed by an n-type layer deposited atop a p-type layer, etching the n-type layer to form etched surfaces providing access for activation of the p-type layer and deposition of a metal contact for injection of current to independently control emission of each of the light emitting device structures; and depositing the metal contacts so that the device comprises a staircase structure with the metal contact on each of the ledges of the staircase structure.

19. The method of claim 18, wherein the p-type layer comprises an as-grown acceptor doped layer and the method further comprises processing to remove hydrogen from inside the p-type layer and at least partially through a porous layer.

20. The method of claim 19, wherein the as-grown acceptor doped layer is doped with an acceptor and the acceptor is magnesium.

21. The method of claim 19, wherein the processing comprises thermal annealing of the device, with an ambient gas comprising at least some air, oxygen, water, or mixed gases.

22. The method of claim 21, wherein the thermal annealing is at a temperature higher than 300° C.

* * * * *